(12) United States Patent
Presman

(10) Patent No.: US 10,348,336 B2
(45) Date of Patent: Jul. 9, 2019

(54) SYSTEM AND METHOD FOR EARLY TERMINATION OF DECODING IN A MULTI USER EQUIPMENT ENVIRONMENT

(71) Applicant: Tsofun Algorithm Ltd., Tel Aviv (IL)

(72) Inventor: Noam Presman, Givatayim (IL)

(73) Assignee: Tsofun Algorithm Ltd., Tel Aviv (IL)

( * ) Notice: Subject to any disclaimer, the term of this patent is extended or adjusted under 35 U.S.C. 154(b) by 64 days.

(21) Appl. No.: 15/813,930

(22) Filed: Nov. 15, 2017

(65) Prior Publication Data
US 2018/0351581 A1 Dec. 6, 2018

Related U.S. Application Data

(60) Provisional application No. 62/515,550, filed on Jun. 6, 2017.

(51) Int. Cl.
*H03M 13/27* (2006.01)
*H03M 13/37* (2006.01)
*H03M 13/29* (2006.01)
*H04L 1/00* (2006.01)
(Continued)

(52) U.S. Cl.
CPC ....... *H03M 13/3746* (2013.01); *H03M 13/13* (2013.01); *H03M 13/2927* (2013.01); *H03M 13/31* (2013.01); *H04L 1/0051* (2013.01); *H04L 1/0061* (2013.01)

(58) Field of Classification Search
CPC .. H03M 13/13; H03M 13/31; H03M 13/3746; H03M 13/2957; H03M 13/2927; H03M 13/6502
See application file for complete search history.

(56) References Cited

U.S. PATENT DOCUMENTS

| 2017/0134049 A1* | 5/2017 | Hsiao | H03M 13/036 |
| 2017/0251479 A1* | 8/2017 | Abdoli | H04J 13/0003 |
| 2018/0191532 A1* | 7/2018 | Mejri | H04L 25/03197 |

OTHER PUBLICATIONS

Arikan, "Channel polarization: A method for constructing capacity-achieving codes for symmetric binary-input memoryless channels", IEEE Transactions on Information Theory vol. 55, No. 7, Jul. 2009.
(Continued)

*Primary Examiner* — Shelly A Chase
(74) *Attorney, Agent, or Firm* — Pearl Cohen Zedek Latzer Baratz LLP

(57) ABSTRACT

A device system and method is provided for early termination of a decoding process performed at a receiving user device. A user-specific message may be received, from a communication channel shared by multiple user devices. The user-specific message may include an error correction codeword generated by shifting an original codeword by an offset codeword uniquely associated with a target user device. The error correction codeword may be shifted based on an offset codeword uniquely associated with the receiving user device. The received message may begin to be decoded. If the receiving device is the target device, the offsets respectively associated therewith are equal and cancel, and the original message is decoded to completion. If, however, the receiving device is not the target device, the offsets respectively associated therewith are not equal and combine to form an above threshold decoding error and decoding is terminated before completion.

20 Claims, 9 Drawing Sheets

(51) Int. Cl.
*H03M 13/31* (2006.01)
*H03M 13/13* (2006.01)

(56) References Cited

OTHER PUBLICATIONS

Presman et al., "Recursive descriptions of polar codes", Adv. in Math. of Comm. 11(1): 1-65, Feb. 2017.
Qualcomm Incorporated, "Early termination for Polar codes", 3GPP TSG-RAN WG1 #89, May 2017, Hangzhou, P. R. China, R1-1709782.
Samsung, "Early Termination of Polar Decoding", 3GPP TSG-RAN WG1 #89, May 2017, Hangzhou, China, R1-1709159.
Nokia, Alcatel-Lucent Shanghai Bell, "Early Termination Benefits of CRC Distribution", 3GPP TSG-RAN WG1 #89, May 2017, Hangzhou, P. R. China, R1-1709188.
Ericsson, "Early Termination of Polar Codes in Downlink", 3GPP TSG-RAN WG1 #89, May 2017, Hangzhou, P. R. China, R1-1709152.
LG Electrionics, "Design of Polar code for control channel", 3GPP TSG-RAN WG1 #89, May 2017, Hangzhou, China, R1-1707673.
Coherent Logix Inc. "Early block discrimination with polar codes for DCI blind detection", 3GPP TSG-RAN WG1 #89, May 2017, R1-1707686.
Catt, "Design of hash Polar codes for early termination", 3GPP TSG-RAN WG1 #89, May 2017, Hangzhou, China, R1-1707524.
"Technical Specification", 3rd Generation Partnership Project; Technical Specification Group Radio Access Network; Evolved Universal Terrestrial Radio Access (E-UTRA); Radio Resource Control (RRC); Protocol specification (Release 14), 3GPP TS 36.331 V14.3.0 (Jun. 2017).
Korada, "Polar Codes for Channel and Source Coding", Thesis No. 4461 Presented at the Informatics Faculty and Communications Laboratory of Communications Theory Doctoral Program in Computing, Communications and Information at the Federal Institute of Technology in Lausanne, France Jul. 15, 2009.
"RAN1 Chairman's Notes", 3GPP TSG RAN WG1 Meeting #88bis Apr. 3-7, 2017, Spokane, USA.
"RAN1 Chairman's Notes", 3GPP TSG RAN WG1 Meeting #89 May 2017, Hangzhou, P.R. China 15th-19th.
Qualcomm, "Control Channel Complexity Considerations", 3GPP TSG-RAN WG1 #87, Nov. 2016, Reno NV, R1-1612089.
Huawei, Hisilicon, "On latency, power consumption and implementation complexity for polar codes", 3GPP TSG RAN WG1 Ad-Hoc Meeting, Jan. 2017, Spokane WA, USA, R1-1700090.
Coherent Logix Inc., "Early block discrimination with polar codes to further accelerate DCI blind detection", 3GPP TSG RAN WG1 Meeting #88, Feb. 2017, Athens, Greece, R1-1701897.
AT&T, "Polar code construction for control channels", 3GPP TSG RAN WG1 Meeting #89, May 2017, Hangzhou, P. R. China, R1-1707747.
Intel Corporation, "Study of early termination techniques for Polar code," 3GPP TSG RAN WG1 Meeting #89, May 2017, Hangzhou, P. R. China, R1-1708316.
Tsofun Algorithm, "Study of Split-CRC Polar Code Construction for Early Termination", 3GPP TSG RAN WG1 NR Ad-Hoc#2, Jun. 2017, Qingdao, China, R1-1709883.

* cited by examiner

SYSTEM AND METHOD FOR EARLY TERMINATION OF DECODING IN A MULTI USER EQUIPMENT ENVIRONMENT

CROSS-REFERENCE TO RELATED APPLICATIONS

The present application claims priority to U.S. Provisional Patent Application 62/515,550 filed on Jun. 6, 2017, which is incorporated herein by reference in its entirety.

FIELD OF THE INVENTION

Embodiments of the present invention relate to digital wireless communication in a multi-device or multi-user equipment (UE) environment, and, in particular, to efficiently and accurately decoding error correction code (ECC) using early termination.

BACKGROUND OF THE INVENTION

In multi-device or multi-user equipment communication systems, messages may be broadcast to multiple devices or UEs over a shared channel. All UEs typically receive the same data over a shared channel, such that, a message intended for one or more UEs (e.g., referred to as a UE-specific or UES message) is received by all connected UEs. Each UE extracts from the shared data only UES messages that are directed to that UE and disregards messages that are not directed to that UE. Modern examples of multi-user cellular communication standards include Long-Term Evolution (LTE) and 3rd Generation Partnership Project-New Radio (3GPP-NR).

To distinguish the intended recipient of UES messages over a shared channel, each UE or set of UEs may be uniquely identified by a user equipment identification number (UEID) and each UES message may include the UEID of the target UE to identify the intended recipient(s). If a UE receives a candidate UES message that ultimately turns out not to be allocated to that UE (e.g., either because the UES message is allocated to another target UE, or due to lack of transmission), the UE should identify this as early as possible and terminate the decoding process to minimize wasted computational resources. Terminating decoding the UES message prior to its completion is referred to as "early termination" or "ET."

Early Termination typically improves UE performance by decreasing decoding latency and power consumption, e.g., eliminating or cutting short decoding attempts of candidate messages that are "false" (not intended for the UE). A disadvantage of ET is that it may lead to false negatives, in which a "true" candidate message (intended for the UE) is wrongly identified by the UE as a false candidate in an earlier decoding stage, whereas the message would have been revealed in a later decoding stage to be a true candidate message if decoding had continued. In such cases, early termination may degrade the accuracy or block error rate (BLER) performance of the decoder. Conversely, the ET may encounter false positives, in which the UE wastes resources decoding false candidate message (not intended for the UE) that are incorrectly identified by the UE as a true candidate.

In conventional ET, the target UEID is typically added as a field in the message header. To determine if a "candidate" UES message is allocated to a particular UE, the UE must usually decode the entire message because the header and message are typically encoded together by the same ECC redundancy. In cases where the header and message are encoded separately, separate ECC redundancy must be transmitted for the header and message body and an additional encoding step is needed to separately decode the header, delaying decoding of the message body. Further, attaching the target device identifier to the message header or body increases the message size and requires additional bandwidth and increases latency.

Accordingly, there is therefore a need in the art of multi-user communication systems to improve the speed and accuracy of ET decisions and decoding UES messages.

SUMMARY OF EMBODIMENTS OF THE INVENTION

According to some embodiments of the invention, an encoder may encode error correction codes or codewords (ECC) in a multiple user equipment system, in which one or more of the messages are UES (directed to only a specific subset of one or more of the multiple UEs). A UE decoder may detect, prior to completing the decoding process, that a UES message is not directed to the UE, and terminate the decoding process. Embodiments of the invention may minimize the time and computational resources wasted on decoding false UES messages by improving the speed and accuracy of ET decisions to determine whether a candidate UES message is true (intended for the UE) or false (not intended for the UE). In some embodiment, the ET decision may achieve a minimum or below threshold rate of false positives, referred to as the False Alarm Rate (FAR), and/or false negatives that contribute to the block error rate (BLER).

A device system and method is provided for early termination of a decoding process performed at a receiving user device. A user-specific message may be received, from a communication channel shared by multiple user devices. The user-specific message may include an error correction codeword generated by shifting an original codeword by an offset codeword uniquely associated with a target user device. The error correction codeword may be shifted based on an offset codeword uniquely associated with the receiving user device. The received message may begin to be decoded. If the receiving device is the target device, the offsets respectively associated therewith are equal and cancel, and the original message is decoded to completion. If, however, the receiving device is not the target device, the offsets respectively associated therewith are not equal and combine to form an above threshold decoding error and decoding is terminated before completion

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, the number of elements, steps, or components (e.g., users in FIG. 1A) are meant only as examples and a greater or fewer number thereof may be used.

DETAILED DESCRIPTION OF EMBODIMENTS OF THE INVENTION

The following notations and conventions may be used. For a real number $x \in \mathbb{R}$, a floor (ceiling) of x denoted by $\lfloor x \rfloor$ ($\lceil x \rceil$) may be the maximum (minimum) integral number less (greater) or equal than x. For any natural number $\ell$, the term $[\ell]$ may denote the set of size $\ell$, $\{0, 1, 2, \ldots, \ell-1\}$. Vectors may be denoted by bold letters and random variables may be denoted by capital letters (e.g., random vectors may be denoted by bold upper-case letters). For $j \leq i$, $u_j^i = [u_j, u_{j+1}, \ldots, u_i]$ may denote a sub-vector of vector u of length $i-j+1$ (if $i<j$, then $u_j^i = [\ ]$, the empty vector, and its length is 0).

Figure 1A:
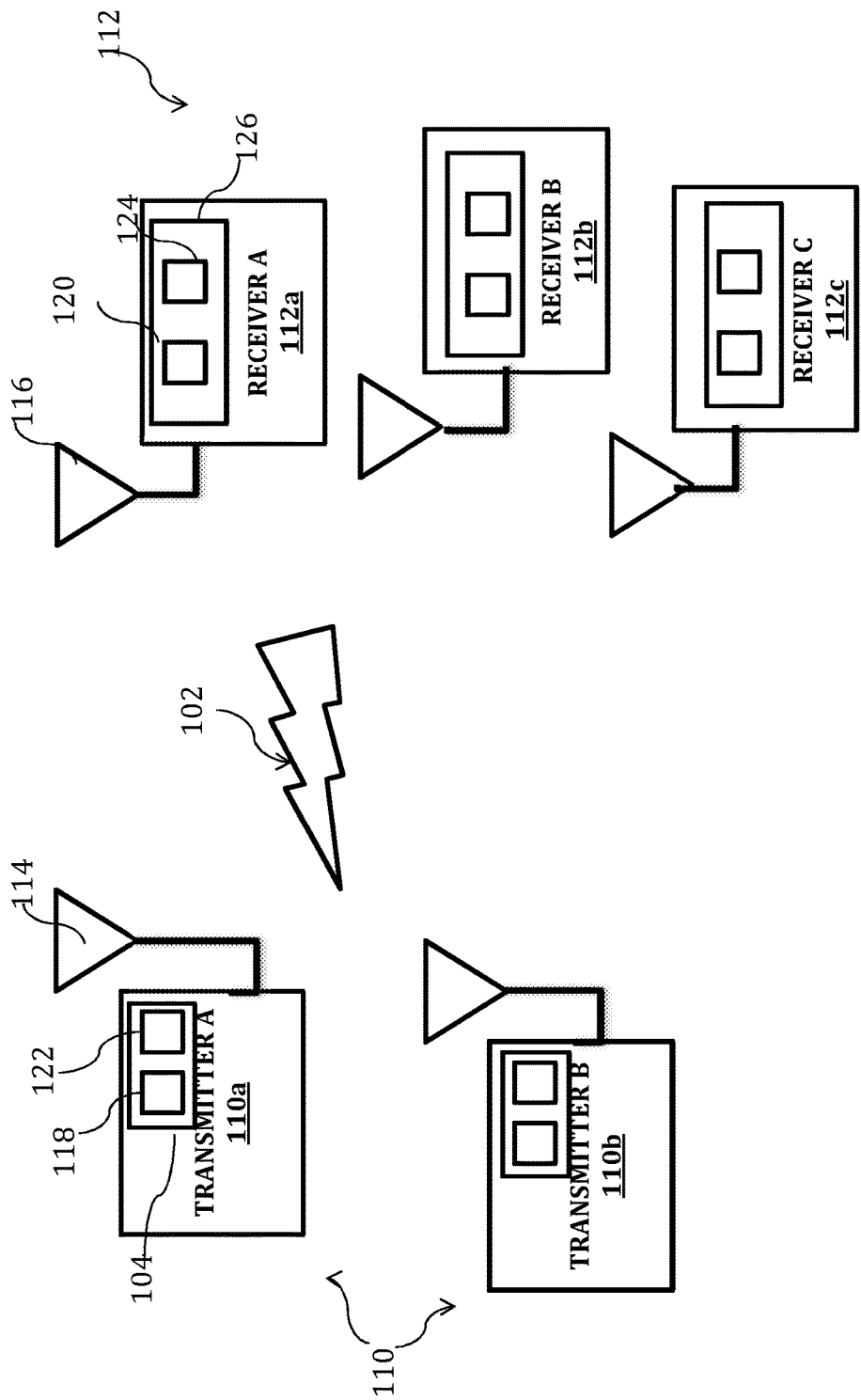
FIG. 1A is a schematic illustration of a multi-user equipment communication system, according to some embodiments of the invention.

Reference is made to FIG. 1A, which schematically illustrates a system operating according to some embodiments of the invention. The system may include one or more source transmitter(s) (e.g., 110a and 110b, collectively 110) and one or more receiver(s) (e.g., 112a, 112b, 112c, collectively 112). Transmitter(s) 110 and receiver(s) 112 may communicate wirelessly or via a wired connection. For wireless communication, transmitter(s) 110 and receiver(s) 112 may include one or more antenna(s) 114 and 116, respectively, for transmitting and/or receiving signals wirelessly over one or more communication channel(s) 102. Receiver(s) 112 may receive one or more noisy error correction codeword(s) transmitted by source transmitter(s) 110 over wired or wireless communication channel(s) 102 and may use a decoder 126 to decode the codeword(s) to reconstruct the transmitted signal.

In some embodiments of the invention, the system of FIG. 1A is a multiple user or user equipment (UE) system. Transmitter(s) 110 may transmit messages to multiple users via respective receivers 112 over a shared channel 102. Accordingly, all (or a plurality) of the multiple user devices receive all (or a plurality) of the transmitted messages. Each user device may accept UE-specific messages that are directed to the user device and ignore messages that are not directed to the user device. Each user device or set of user devices may be identified by a user equipment identification number (UEID). Transmitter(s) 110 may include an encoder 104 to embed the target UEID of the intended recipient inside the message. Receiver(s) 112 may use decoder 126 to decode received messaged to determine whether or not the message is directed to that user device. If not, the user device may identify the message as "false" or "misdirected" (not intended for the UE) as early as possible and terminate decoding the message. Early termination is beneficial for increasing throughput and decreasing power. On the down side, ET may lead to false negatives, in which an input to the decoder is wrongly identified as a misdirected message in a relatively earlier stage, resulting in a degradation in frame error rate performance of the decoder.

In one embodiment of the invention, an encoder 104 in a transmitting device may embed a target UEID within the transmitted codeword, which may enable a decoder 126 in a receiving device to perform early termination with mitigated effect on the error correction performance. In some embodiments, encoder 104 may embed the UEID by shifting the message codeword by an offset codeword uniquely associated with the target UEID.

Transmitter(s) 110 and receiver(s) 112 may include one or more controller(s) or processor(s) 118 and 120, respectively, configured to execute operations or processes according to embodiments of the invention and one or more memory unit(s) 122 and 124, respectively, configured to store data used according to embodiments of the invention such as inputs or outputs from each of the operations or computations and/or instructions (e.g., software) executable by a processor, for example for carrying out methods as disclosed herein. Processor(s) 118 may encode codewords to be transmitted by transmitter(s) 110 over the shared channel 102 and processor(s) 120 may decode a noisy version of the transmitted codewords.

Processor(s) 118 and 120 may include, for example, a central processing unit (CPU), a digital signal processor (DSP), a microprocessor, a controller, a chip, a microchip, an integrated circuit (IC), or any other suitable multi-purpose or specific processor or controller. Processor(s) 118 and 120 may individually or collectively be configured to carry out embodiments of a method according to the present invention by for example executing software or code. Memory unit(s) 122 and 124 may include, for example, random access memory (RAM), dynamic RAM (DRAM), flash memory, volatile memory, non-volatile memory, cache memory, buffers, registers, short term memory, long term memory, or other suitable memory units or storage units. Processor(s) 118 and 120 may be general-purpose processors executing special-purpose decoding software and/or special-purpose hardware units that are a dedicated encoder 104 and decoder 126, respectively.

Figure 1B:
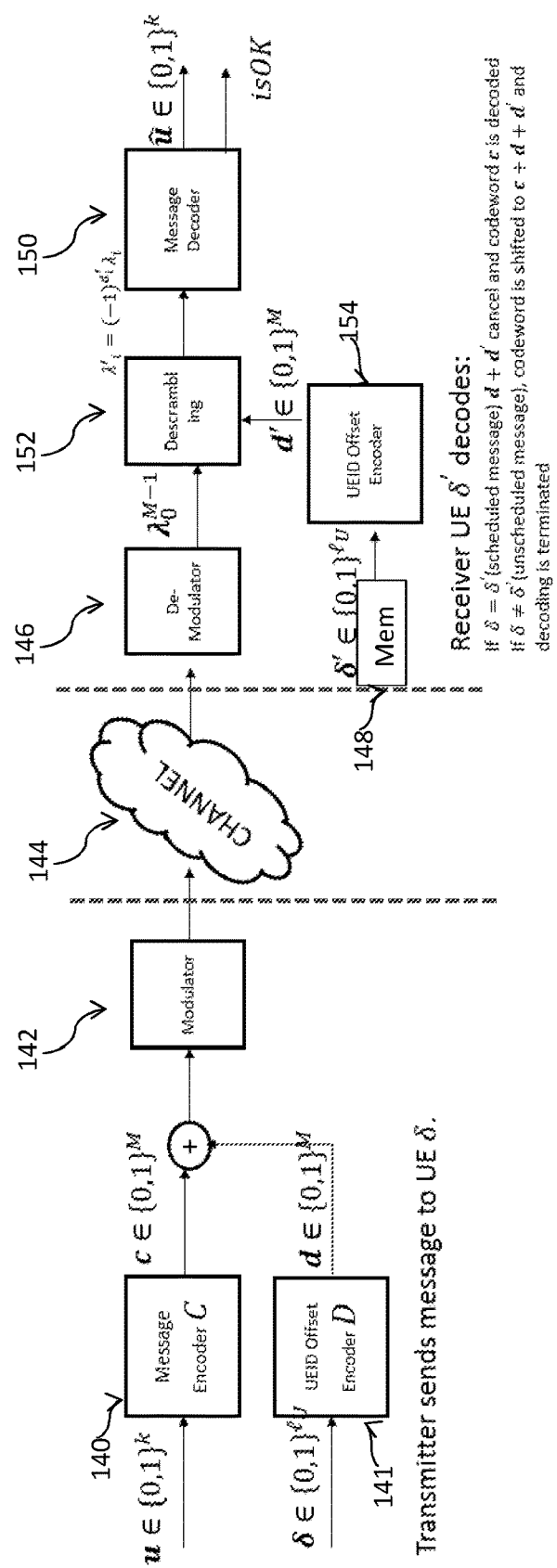
FIG. 1B is a schematic illustration of a system comprising an ECC encoder and an ECC decoder with early termination capabilities, according to some embodiments of the invention.

Reference is made to FIG. 1B, which schematically illustrates a system comprising an ECC encoder 140 and an ECC decoder 150 with early termination capabilities, according to some embodiments of the invention. Encoder 140 may be integral to, or operatively connected to, a transmitting device (e.g., transmitter 110 of FIG. 1A) and decoder 150 may be integral to, or operatively connected to, a receiving device (e.g., receiver 112 of FIG. 1A) in a multi-user system (e.g., the system of FIG. 1A).

Encoder 140 may encode a message u. The message may be UE-specific, i.e., intended for one or more target user devices S from among multiple user devices in the system. Encoder 140 may encode the UE-specific message u to generate an original message codeword c from a codebook. Encoder 141 may encode an identifier uniquely associated with the target user device to generate a shifted offset codeword d. The offset codeword d may be combined with, and shift, the message codeword c to generate a shifted codeword, e.g., c+d. For example, the offset codeword d may encode a unique user equipment identification number (UEID or ID). The original message codeword c and offset codeword d may have the same length, resulting in a shifted codeword c+d with the same size as the original codeword c.

A modulator 142 may modulate the shifted error correction codeword to generate a modulated codeword (e.g., M(c+d)). The transmitting device may transmit the UE-specific modulated codeword over a communication channel 144 shared by the multiple user devices (e.g., shared channel 102 of FIG. 1A).

The multiple receiving devices may all receive the same UE-specific modulated codeword (ECC) from the shared communication channel 144. FIG. 1B shows the operation of each one of the multiple receiving devices δ'.

The receiving device δ' may include a demodulator 146 to demodulate the received signal. The receiving device δ' may include a memory 148 for storing an identifier, e.g., UEID, uniquely associated with the receiving device δ', or an offset codeword encoded therefrom d'. If the identifier is stored, an offset encoder 154 may encode the identifier to generate the offset codeword d'. Otherwise the offset codeword d' itself may be retrieved directly from memory 148.

The receiving device δ' may include a descrambler 152 to shift the received (and/or demodulated) error correction codeword c+d by an offset codeword d' associated with receiving device δ' to generate, and send the decoder 150, a twice-shifted error correction codeword c+d+d'.

The decoder 150 may start to decode the noisy twice-shifted error correction codeword c+d+d'. If the receiving device is the target device (δ=δ'), the target offsets d and the receiving device offset d' are equal (d=d') and cancel (d+d'→0, where like symbols 0+0=0 and 1+1=0 in a binary representations). The twice-shifted error correction codeword c+d+d' thus simplifies to the un-shifted original message codeword c, and the decoder 150 decodes the original message codeword c to completion. If, however, the receiving device is not the target device (δ≠δ'), the target offsets d and the receiving device offset d' are not equal (d≠d') and their combined offsets will not cancel. This may result in the absolute value of the decoding path metric being above a threshold (e.g., maximal) absolute value path metric or decoding error, d+d'. The decoder 150 may measure the decoding error of the twice-shifted error correction codeword and when that error is above a threshold, may terminate the decoding process immediately and/or prior to completion.

In other words, the offset codeword d+d' may be in a different codebook than c. Thus, unless the receiving device is the target and its offset d' cancels the offset codeword d, the twice-shifted codeword c+d+d' will be in a different codebook than c and decoder 150 using that codebook will yield great error, causing decoding to stop.

In conventional multi-user systems, the target device identifier (e.g., UEID) is added to the UES message, e.g., as an extra target UEID field in the header. In such systems, either the entire message must be decoded before the header can be read (when the header and message body are encoded together by the same ECC redundancy) or separate ECC redundancies must be transmitted for the header and message body and an additional decoding step must be performed to separately decode the header, which delays decoding the message body. Further, adding extra UEID bits in the header increases transmission size, which results in additional bandwidth consumption and increased latency.

In contrast, some embodiments of the invention embed the identity of the target device, not in the message, but in the encoding of the message. By shifting the original message codeword c by an additional offset codeword d associated with the target device's identity, only the same target device possesses the same offset d'=d that cancels and un-shifts the twice-shifted codeword back to its original code c. All other non-target devices possess different offsets d'≠d that further shift the shifted codeword to maximize the distance or error between the shifted codeword and the original codeword. When the shifted codeword's error grows, e.g., above a threshold, this indicates that the decoder possesses the wrong identifier associated with a non-target device, and the decoder terminates the decoding process before completion, e.g., before the message (e.g., including its header) are decoded. In contrast to conventional systems, such embodiments of the invention encode the target device's identifier using no additional bits of information (maintaining the original message size) and requiring no separate decoding stage for the header or decoding the entire message (resulting in no delay to decode the message). Instead, the receiving device determines the target identifier by the process of decoding itself. Embedding the target device's identifier in the message encoding itself thus reduces message size, increases the speed of the early termination decision, and thereby reduces computations wasted on decoding false messages, and increases decoding speed, as compared to conventional systems. Experimental results show embodiments of the invention reduce ET latency and decoding computations of typically between 40-70% compared to conventional systems.

Given a set of possible symbol values F, an error correction code (ECC) (denoted as C) of length n symbols may be a subset of an n-dimensional field $F^n$. The rate of C may be defined, for example, as $$R = \frac{\log_2 |C|}{n \cdot \log_2 |F|},$$

based on the size or magnitude of the code |C|, the size of the field |F| and the length of the code n. For example, as the codeword length n increases, the rate R decreases and the speed decreases for communicating or transferring information. If the set of possible signal values F is a field and C is a linear space in $F^n$, C is a linear code over F. Such a code C may be defined, in one example, by a generating matrix B having, e.g., k=R·n rows and n columns, such that C={v·B|v∈$F^k$}. The parameter k may denote the code dimension, e.g., such that |C|=|F|$^k$ (the code dimension k is equal to the base |F| logarithm of the size of the code). A dual space of a linear code C may be denoted as $C^⊥$ and may be defined as a plurality of all vectors in $F^n$ that are orthogonal to all the codewords in C. Thus, the dual space $C^\perp$ is orthogonal to its code space C such that any codeword $c^\perp \in C^\perp$ is orthogonal to any codeword $c \in C$, e.g., $c^\perp \cdot c = 0$. Codewords $c^\perp$ of the dual space $C^\perp$ may be generated by a dual space generating matrix H (e.g., a parity check matrix of C) that may have, for example, n columns and n–k rows, such that $c \in C$ if and only if $c \cdot H^T = 0$. A syndrome s of a length n vector v may be defined, for example, as $s = v \cdot H^T$. Thus, the syndrome of codewords $c \in C$ is, for example, zero. A syndrome may measure the result of applying the parity check equations (e.g., columns of H) to the values of a codeword v. When all the parity check equations are satisfied (e.g., $v \cdot H^T$ is equal to the zero vector), then codeword v is a codeword in C.

Consider a channel (e.g., 102 of FIG. 1A, 144 of FIG. 1B) carrying signals $x \to y$ in which a signal $x \in X$ is transmitted using a transmitter over the channel and a noisy version of the signal $y \in y$ is received at a receiver. The channel may be "memoryless," meaning that the channel noise at one time for one transmission $x_i \to y_i$ is independent of the channel noise at another time for another transmission $x_j \to y_j$. A maximum likelihood (ML) codeword decoder may determine for each received channel observation vector y, the most probable transmitted codeword x, for example, by maximizing the following likelihood:

$$Pr(Y_0^{n-1} = y_0^{n-1} | X_0^{n-1} = x_0^{n-1}) = \Pi_{j=0}^{n-1} Pr(Y_j = y_j | X_j = x_j) \quad (1).$$

This likelihood defines the probability or likelihood of receiving a channel observation vector y if a codeword x is sent over the channel. The maximum likelihood codeword decoder may be defined, for example, as:

$$\hat{x} = \text{argmax}_{x_0^{n-1} \in C} Pr(Y_0^{n-1} = y_0^{n-1} | X_0^{n-1} = x_0^{n-1}), \quad (2)$$

to detect the transmitted codeword $\hat{x} = x_0^{n-1} \in C$ that maximizes this probability, e.g., equation (1). For any decoding criterion, the block error rate (BLER) may be the probability that the decoder to fail to detect the correct codeword, i.e., $Pr(\hat{X} \neq X)$. If each codeword in an ECC C is sent over the channel with same probability (e.g., the system has no preference or bias for certain codewords over others, such as preferring 0's over 1's in a binary system), then this maximum likelihood criterion corresponds to a minimum block error probability (i.e. BLER) defining a minimum probability of error that the estimated codeword $\hat{x}$ is incorrect. If codewords in an ECC C are transmitted with bias, then the maximum likelihood criterion above may be replaced with $Pr(Y_0^{n-1} = y_0^{n-1} | X_0^{n-1} = x_0^{n-1}) Pr(X_0^{n-1} = x_0^{n-1})$ to take the preference into account. In such a case, the criterion may be referred to as a maximum posteriori probability (MAP) criterion.

According to some embodiments of the invention, $C^{(1)}$ and $C^{(2)}$ may be two linear codes in a space $F^n$. $C^{(1)}$ may be a set of all possible codewords of length n and may contain $C^{(2)}$, for example, $C^{(2)} \subseteq C^{(1)}$, where $C^{(2)}$ may be referred to as a sub-code of $C^{(1)}$. $k_1$ and $k_2$ may be used to denote the code dimensions of $C^{(1)}$ and $C^{(2)}$, respectively. $\lambda$ may be used to denote a codeword $\lambda \in C^{(1)}$. A coset of $C^{(2)}$ in $C^{(1)}$ induced by codeword $\lambda$ may be defined, for example, as $\{\lambda + c | c \in C^{(2)}\}$. This coset may be denoted as $\lambda + C^{(2)}$ or $C^{(2)} + \lambda$. Because linear spaces are closed under addition, and both codeword $\lambda$ and sub-code $C^{(2)}$ are contained in $C^{(1)}$, their sum, coset $\lambda + C^{(2)}$, is also contained in $C^{(1)}$, for example, $\lambda + C^{(2)} \subseteq C^{(1)}$. Since $C^{(1)}$ has $|F|^{k_1}$ elements and $C^{(2)}$ has $|F|^{k_2}$ elements, according to the Lagrange theorem, the cosets of $C^{(2)}$ partition $C^{(1)}$ into $$\frac{|C^{(1)}|}{|C^{(2)}|}$$

distinct codeword subsets. Furthermore, all the vectors in the same coset have the same syndrome. In other words, if $x \in \lambda + C^{(2)}$, $w \in F^n$ and H is a parity check matrix of $C^{(2)}$, then $x \cdot H^T = w \cdot H^T$ if and only if $w \in \lambda + C^{(2)}$.

Figure 2:
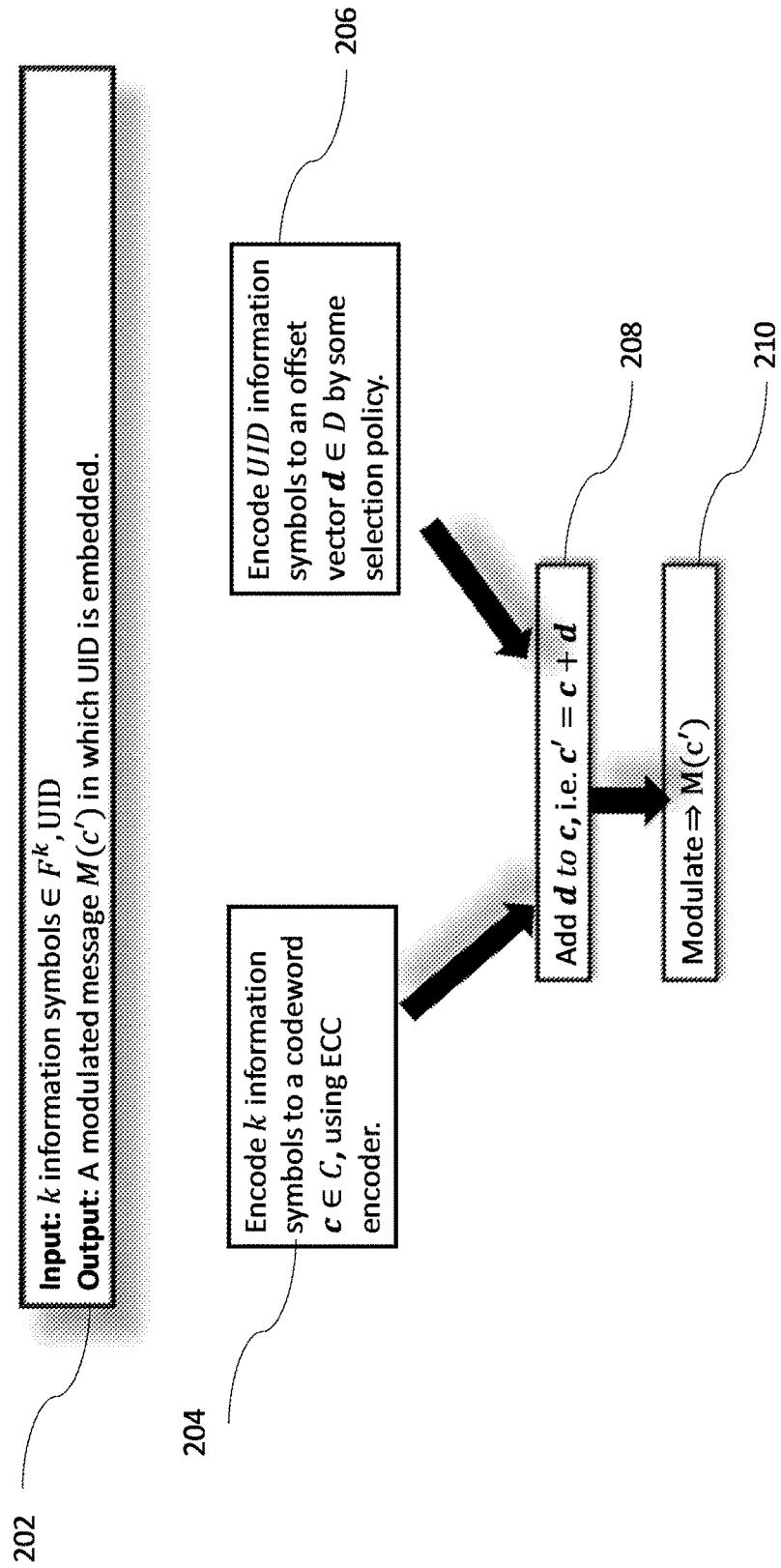
FIG. 2 is a flowchart of a process executed by an ECC encoder to embed UEIDs within UES messages, according to some embodiments of the invention.

Reference is made to FIG. 2, which is a flowchart of a process executed by an ECC encoder (e.g., 104 of FIG. 1A) to embed UEIDs within UES messages, according to some embodiments of the invention. An example input and output of the encoder is defined in 202.

In the example of FIG. 2, a processor receives an original message u comprising k information symbols and a UE identifier (e.g., UEID) associated with the intended target recipient(s). An encoder (e.g., 140 of FIG. 1B) encodes the k symbols to generate a codeword C, for example, a linear code of code length n with dimension k over F, i.e. $C \subseteq F^n$. An encoder (e.g., 141 of FIG. 1B) encodes the UEID to generate a UEID offset word of length n, $d \in F^n$, where the number of UEIDs in the system may be less than or equal to $|F|^{n-k}$. The encoder may perform the following operations, where the set of encoded UEIDs d is denoted by D and the modulation of a word x is denoted by M(x):

1) Encode an information word $u \in F^k$ to generate a codeword $c \in F^n$ (204).
2) Select an offset vector to represent the UEID, $d \in D$ (206).
3) Add to c the UEID offset (of the target of the message), e.g., $c' = c + d$ (208).
4) Modulate c', e.g., M(c'), and transmit by a transmitter (e.g., transmitter 110 of FIG. 1A) over a channel (e.g., shared channel 102 of FIG. 1A) (210).

Figure 3:
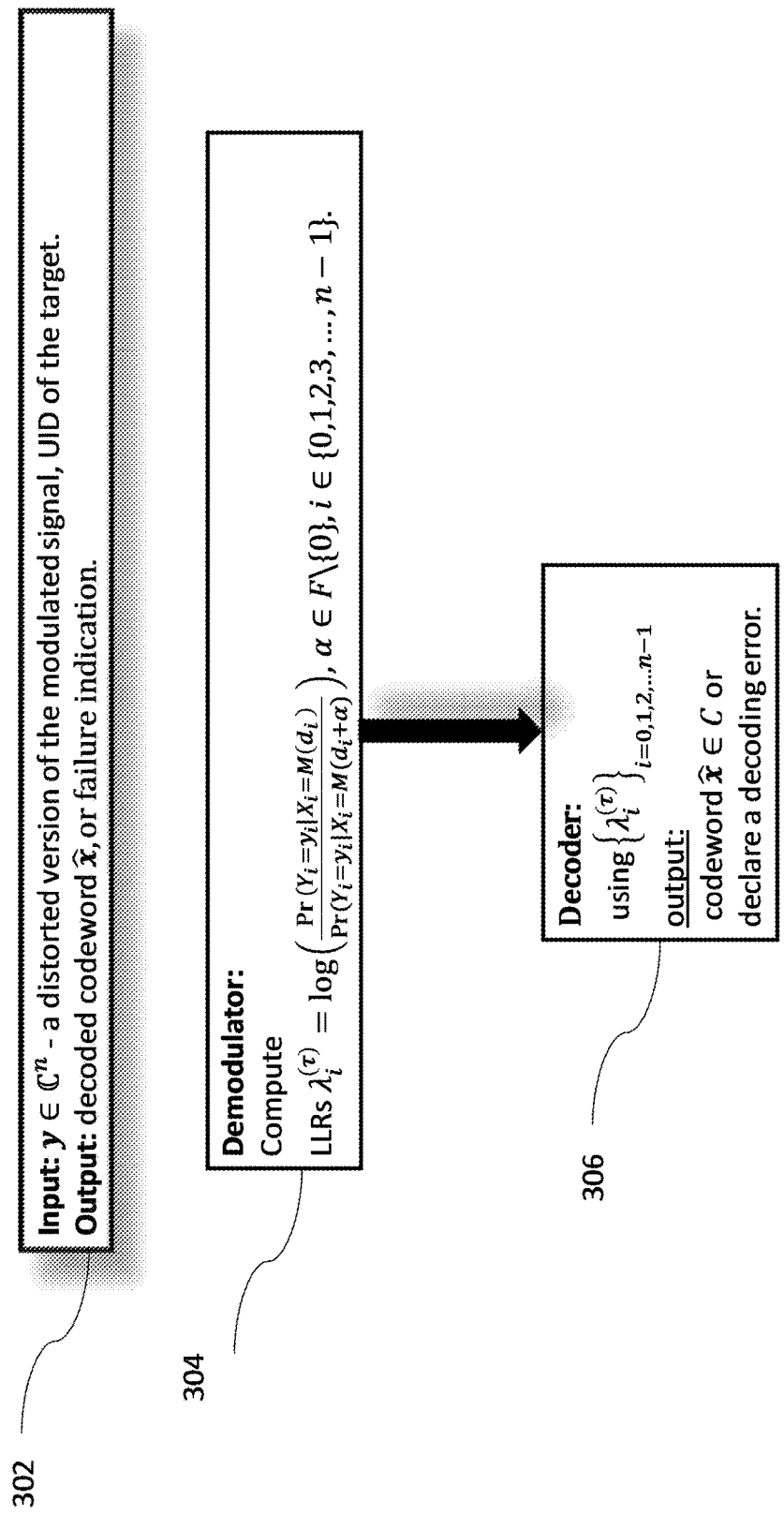
FIG. 3 is a flowchart of a process executed by an ECC decoder to decode UES messages and make early termination decisions based on the embedded UEIDs described in reference to FIG. 2, according to some embodiments of the invention.

Reference is made to FIG. 3, which is a flowchart of a process executed by an ECC decoder (e.g., 126 of FIG. 1A or 150 of FIG. 1B) to decode UES messages and make early termination decisions based on the embedded UEIDs described in reference to FIG. 2, according to some embodiments of the invention. An example input and output of the decoder is defined in 302.

The decoder receives an input signal $y \in C^n$, which is a distorted or noisy version of the transmitted signal M(c') received by a receiver (e.g., receiver 112 of FIG. 1A) over a channel (e.g., shared channel 102 of FIG. 1A). A demodulator (e.g., 146 of FIG. 1B) may compute and send the decoder log-likelihood ratios (LLRs) of the above probabilities, $$\text{e.g., } \lambda_i^{(\tau)} = \log\left(\frac{Pr(Y_i = y_i | X_i = M(d_i))}{Pr(Y_i = y_i | X_i = M(d_i + \alpha))}\right),$$

$\alpha \in F \setminus \{0\}$, $i \in \{0, 1, 2, 3, \ldots, n-1\}$.

In one embodiment, the decoder may be a sequential decoder executing a sequential decoding process that has v steps, such that in each step $0 \leq i \leq v-1$, the decoder serially determines the sub-code $C^{(i)} \subseteq C$ to which the transmitted codeword belongs. The sequential decoder may decode such that the sub-code in each sequential step is a subset of the code or sub-code in the previous step, $C^{(i)} \subseteq C^{(i-1)}$, where $1 \leq i \leq v-1$. A sequential decoding process with a candidate codeword list of size L, may be a generalization of this process, in which, in step i the decoder selects at most L sub-codes $C^{(i,j)}$ such that $C^{(i)} \subseteq C$ and $j \in [L]$. Moreover, $\forall j \in [L] \exists j' \in [L]$ such that $C^{(i,j)} \subseteq C^{(i-1,j')}$. In other words, for a sub-code to exist in step i it has to be a sub-set of a sub-code included in step i−1. The sequential decoder thus iteratively narrows the candidate codeword list until a single candidate from the final step is selected, e.g., having the highest path metric.

A path-metric (PM) of a certain list of candidate codewords $C^{(i)}$ may be defined, for example, as the log-likelihood of the decision, e.g., $PM(C^{(i)})=\log(Pr(Y=y, X=M(c))$, where $c \in C^{(i)}$). PM is an example of a preferability or confidence score. For example, PM may indicate a log likelihood of a current hypothesis. As the PM increases, the probability that the hypothesized codeword is true also increases. In some embodiments of the invention, $PM(C^{(i)})$ can be any monotonic function of the form defined above. The decoder may attempt to determine a codeword c such that PM(c) is maximum, which reduces the error e.g., BLER, to a minimum.

In some embodiments of the invention, a criterion that causes early termination of a decoding algorithm, may degrade the BLER performance. The amount of performance degradation may be limited by a threshold, e.g., to be less than γ·BLER, where γ is a factor that limits the degradation of block error rate due to early termination (e.g., limits the false negative probability). An early termination process may decide to reject a set of received codewords R and stop decoding in step i. An upper-bound or threshold on the degradation increase due to step i is, e.g., $\Sigma_{\gamma \in R} Pr(Y=y, X=M(\gamma))$, where $\gamma \in C^{(i)}$, while $c \in C^{(i)}$). For an input signal y to be rejected, a criterion for early termination may be that the likelihood that the set $C^{(i)}$ (the true sub-code of C at step i that transmitted codeword c belongs to) contains the received codeword (e.g., $Pr(Y=y, X=M(\gamma))$, where $\gamma \in C^{(i)}$, while $c \in C^{(i)}$)) is below a certain threshold. Equivalently, some embodiments may reject the set of codewords $C^{(i)}$ if the PM of a codeword in $C^{(i)}$ at step i is below a threshold τ. Threshold τ may be a function e.g., of:

The decoding stage (i).
The channel and or channel conditions (e.g., signal to noise ratio (SNR)).
The codebook.

An example threshold τ is, for decoding stages:
i≤60 use τ=−20
i>60 use τ=−50

In embodiments using list sequential decoding, the threshold may be applied to a maximum among PMs of the candidate codewords determined in step i.

Figure 4:
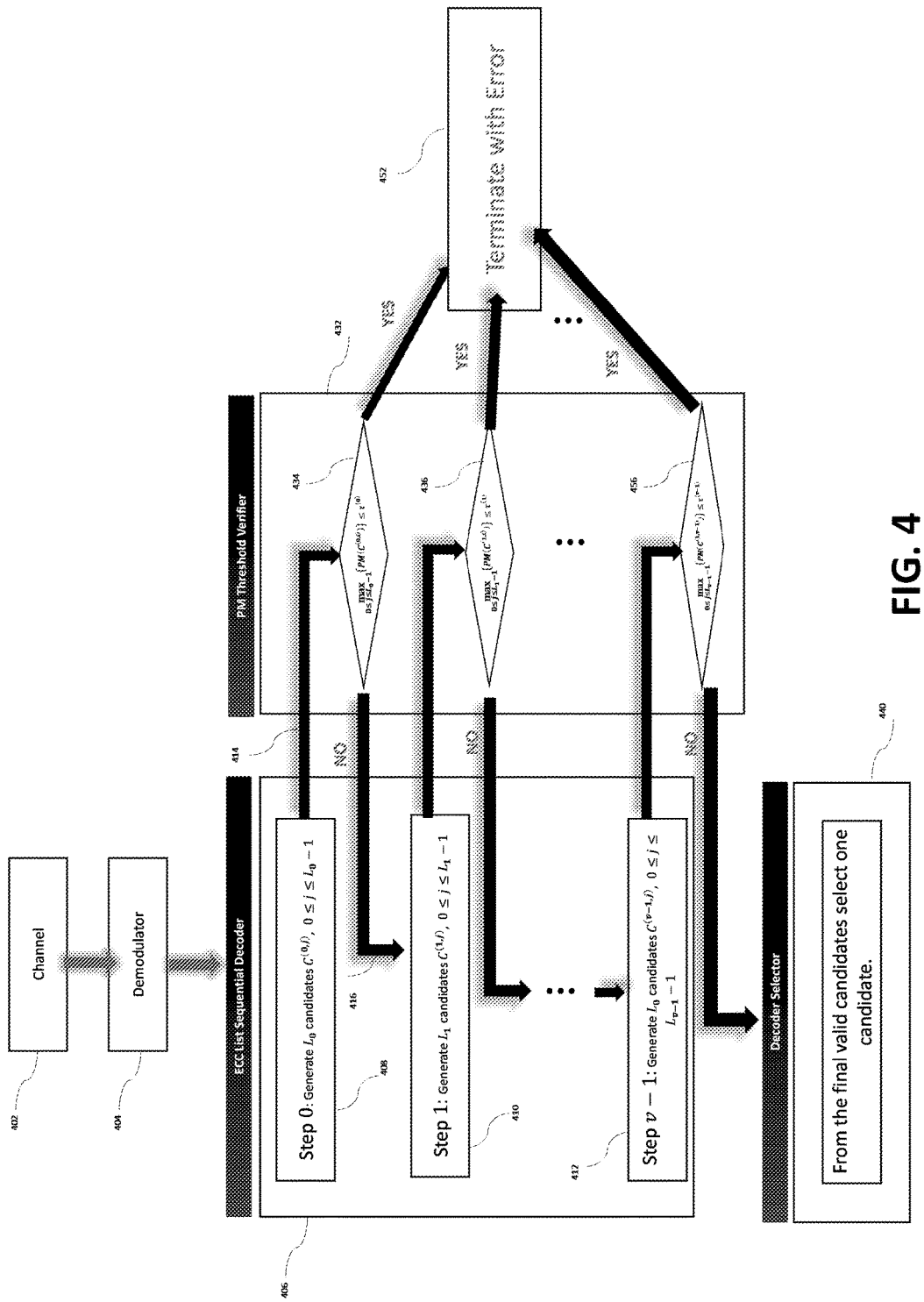
FIG. 4 is a schematic illustration of a system including an ECC sequential decoder that supports early termination, e.g., based on path metrics of candidate messages, according to some embodiments of the invention.

Reference is made to FIG. 4, which schematically illustrates a system including a list sequential decoder 406 integrated with a PM threshold verifier 432 that supports early termination, according to some embodiments of the invention.

A noisy codeword may be received over a channel 402 (e.g., shared channel 102 of FIG. 1A or 144 of FIG. 1B). A demodulator 404 (e.g., demodulator 146 of FIG. 1B) may demodulate the received codeword, e.g., into a set of LLRs. A sequential list decoder 406 (e.g., decoder 126 of FIG. 1A or 150 of FIG. 1B) decodes a code C in a sequence of steps i, i=0, . . . , v−1. The sequential decoder 406 may implement a multi-step decoding process, where, in each step, the decoder may reduce the number of candidate codewords to be evaluated for decoding. A PM threshold verifier 432 executes a test, following each ith decoding step of the sequential decoder 406, to perform a condition verification on the output of that step for determining whether or not to terminate the decoding process. PM threshold verifier 432 may run in sequence or in parallel to sequential decoder 406 (e.g., so that there is no delay in decoding).

In one example, in step zero (0) (408), the list sequential decoder 406 generates a list of $L_0$ candidate codewords that are sent to the PM threshold verifier (414). The PM threshold verifier 432 may verify a condition based on the PM of the candidates (or any other function thereof). For example, the PM threshold verifier may verify whether or not the maximum PM (e.g., or average or other function of the PMs) for the candidates in list $L_0$ is below the threshold $\tau^{(0)}$. If so, the PM verifier sends a signal to the decoder to terminate decoding with error (452). Otherwise, if the termination threshold is not met (416), then the sequential decoder may proceed to next decoding step (410). The list of candidates is updated after each step by removing individual candidates with PM below the threshold $\tau^{(0)}$ before entering the following step 1 (410). This flow continues such that after each decoder 406 step i, verifier 432 checks a condition on the resultant PMs, such that if the highest PM is below $\tau^{(i)}$ then decoding terminates (e.g., after 410 the condition is 436). In some embodiment of the invention, candidates with a PM below the threshold $\tau^{(i)}$ may be removed before entering step i+1 (410). This procedure repeats sequentially until either step v−1 completes (including both generating candidates 412 and then verifying the PM threshold 456), or a termination decision 452 occurs. If the decoding process has not terminated, a decoder selector 440 may select one candidate codeword to be the decoder 406 output. In one embodiment of the invention the selected candidate is the codeword from step v−1 with highest PM score.

In one embodiment of the invention, thresholds can be determined by considering the distribution of the PMs of candidate codewords in a correct decision and selecting thresholds such that terminating decoding below those thresholds degrades the BLER by less than or equal to γ·BLER, where γ is a tuning parameter adjusted according to system and scenario requirements. For example, γ may be set inversely proportionally to precision requirements of the system. In one example, a relatively low γ may be set in systems that has relatively high accuracy requirements (e.g., γ=0.1).

Figure 5:
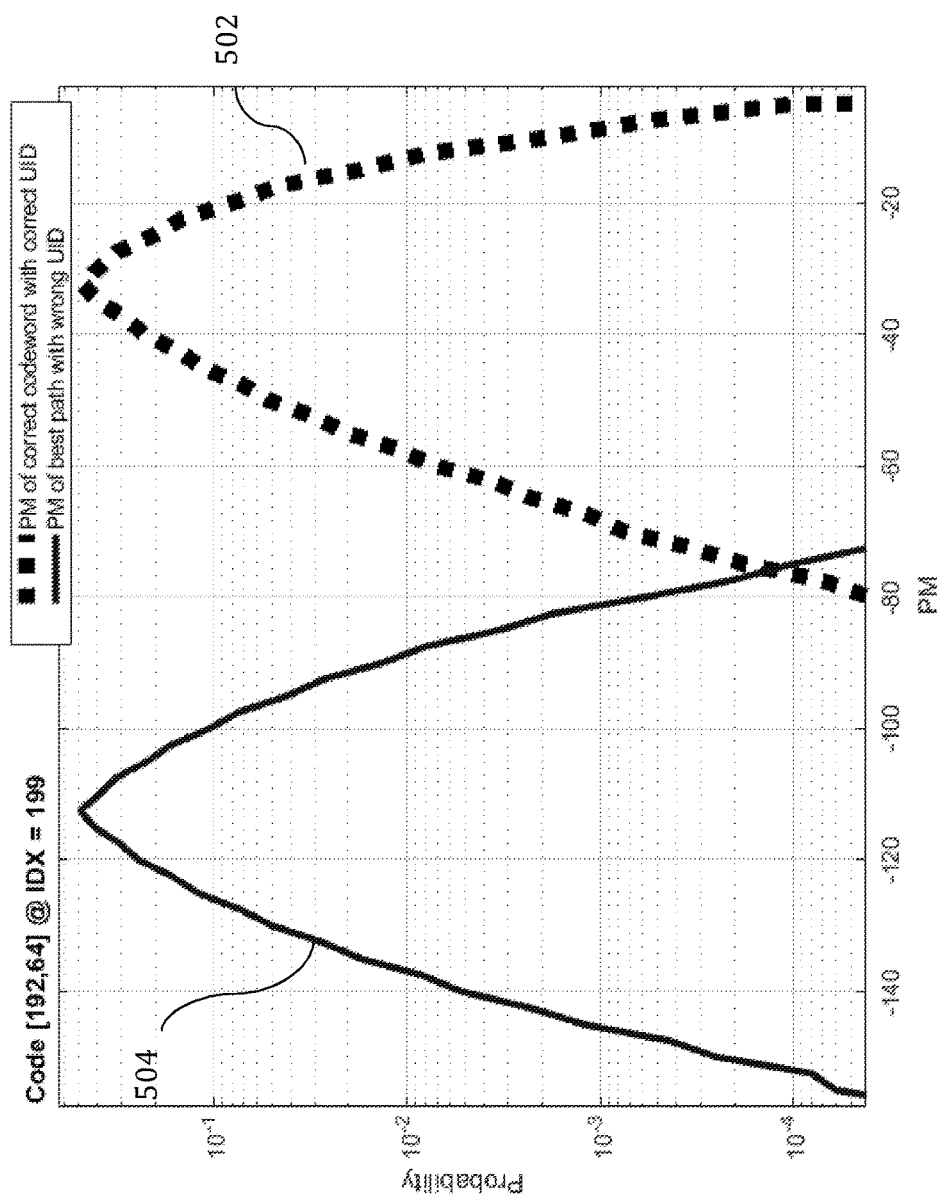
FIG. 5 is a graph of a two-sided cumulative distribution function of a path metric (PM) of a correct codeword (intended for the UE) and a PM of a best path of a false codeword (not intended for the UE), according to some embodiments of the invention.

Reference is made to FIG. 5, which is a graph of a two-sided cumulative distribution function (CDF) of a path metric (PM) of a correct codeword (intended for the UE) and a PM of a best path of a false codeword (not intended for the UE), according to some embodiments of the invention. In FIG. 5, the left lobe of the CDF (dashed curve) represents the PM of the correct codeword with the same UEID 502 and the right lobe of the CDF (solid curve) represents the PM of the best path (candidate) for cases with a wrong UEID 504. A two-sided CDF $F_X(x)$ for a random variable X may be defined, e.g., as $F_X(x)=\min\{Pr(X \geq x), Pr(X \leq x)\}$ or in other words:

$$F_X(x) = \begin{cases} Pr(X \leq x) & x \leq \text{median}_X \\ Pr(X \geq x) & o.w. \end{cases},$$

where $\text{median}_X$ is the median of random variable X.

For example, if the BLER of a code is $10^{-3}$ and γ≤0.1, then decoding may terminate for all candidates with an accuracy below ≤$10^{-4}$, i.e., with a PM below the threshold τ=−77 (according to right curve in FIG. 5). Note that in this case, a false candidate with a wrong UEID above this threshold with probability of $2 \cdot 10^{-4}$ would not terminate decoding (according to left curve in FIG. 5). The threshold or γ may be tuned to balance the goals of excluding more false candidates (achieved by increasing the threshold) with preventing early termination of correct codewords (achieved by lowering the threshold). This balance may occur, in one example, at the intersection of the PMs of the two lobes of the two-sided CDF.

According to some embodiments of the invention, the set D of UEID offset words d may be selected such that the set has a minimum probability of having PM above the threshold $\tau$ associated with a BLER degraded by a factor of $\gamma$. In one example, for a threshold $\tau$, the set D may be selected, such that $\Sigma_{d \in D} \Sigma_{d' \in D \setminus \{d\}} \Pr(PM \geq \tau | c+d$ was transmitted, while c+d' is assumed, c$\in$C) is minimum.

There exist channels in which the decoding accuracy is correlated with a distance between the decoded codeword modulation and the received codeword. For those channels, the ML decoder may search for a codeword that minimizes that distance for each received vector y. For example, in additive Gaussian channels, a Euclidean distance $dist_E$ may be used, and in binary symmetric channels, a Hamming distance $dist_H$ may be used.

In cases where the performance of the code is determined by a distance measure, a heuristic approach may be used to determining a set D with sufficiently good performance based on the following approach. In one embodiment, the set D may be selected such that dist(M(c), M(c'+d+d')) is minimized for all c, c'$\in$C, d, d'$\in$D where d$\neq$d'. A generalization of this approach may be to consider a distance spectrum of the above.

For sequential decoders, in order to increase the probability of early termination in step i given a threshold $\tau$, the distance between the sub-codes of this step, e.g., dist(M($C^{(i)}$), M($C^{(i)}$'+d+d')) may be minimized, where $C^{(i)}$, $C^{(i)}$'$\in$C sub-codes considered in step i of the process, d, d'$\in$D where d$\neq$d'. A distance between two set may be defined as the minimum distance among pairs of items from the sets, e.g., $dist(A_0, A_1) = \min_{x^{(0)} \in A_0, x^{(1)} \in A_1} dist(x^{(0)}, x^{(1)})$.

In one embodiment of the invention, C is a polar code. Polar codes are linear error correction. In the case of polar codes, the set of offset words D may be equivalent to each UEID by a vector encoded on a subset of the frozen symbols C. In cases where there is a correspondence between Hamming weight and Euclidian weight (e.g., binary polar code modulated into BPSK or QPSK) the task of selecting the set D reduces to picking a subset of the codewords induced by frozen symbols such that vectors have a maximum weight. For polar code, the minimum weight (distance) of each subset may be defined such that the effect of selecting a set of frozen symbols is easily detectable.

In one embodiment of the invention, an encoder may embed a UEID into a UES message by locating the binary representation of the UEID on frozen symbols of the UES message corresponding to (1) rows of largest available Hamming weight in the generating matrix (e.g., corresponding to the largest shift in offset) and/or (2) with smallest index (e.g., corresponding to bits located earliest in the codeword that may be decoded in an earlier decoding step). In some embodiments, low index bits often have low Hamming weights, so criterion (1) may be applied first, and (2) may be applied only when ties occur in (1). The first criterion is used to provide the maximum distinction between codeword (or sub-code) and a shift of any codeword (or sub-code) by a vector d generated from the frozen symbols. The second criterion is useful in order to observe this distinction during an earliest possible stage of the decoding process.

In one embodiment of the invention, an encoder may embed a UEID into a UES message by locating the binary representation of the UEID (of size $\ell$) on a selected set of r>$\ell$ frozen symbols of the UES message corresponding to (1) rows of large Hamming weight in the generating matrix and (2) with smallest index (note that (2) is applied when ties occur in (1)). The first criterion is used to provide a maximum distinction between a codeword (or sub-code) and a shift of any codeword (or sub-code) by offset word d generated from the frozen symbols. The second criterion is useful in order to observe this distinction during an earliest possible stage of the decoding process. The transformation of $\ell$ bits into r bits may be performed using an appropriate hash or other function.

In another embodiment of the invention, an encoder may embed a UEID into a UES message by locating the binary representation of the UEID (of size $\ell$) on a selected set of r$\geq$$\ell$ frozen symbols of the UES message corresponding to indices with large quality scores (e.g., mutual information, decoding success probability, or others). For example, for frozen symbol i, mutual information $I(u_i; y, u_0^{i-1})$ between a symbol $u_i$ and a combination of the channel observation vector y and previously decoded symbols $u_0^{i-1}$ (e.g., the Shannon capacity of the channel $u_i \to [y, u_0^{i-1}]$) may measure the dependency between $u_i$ and $[y, u_i^{i-1}]$, such that as this score grows, the chance of successful decision of $u_i$ given $[y, u_0^{i-1}]$ also grows. Quality scores may take into account the index of the frozen symbol in the decoding process, for example, measuring the order of the frozen symbols of the polar code. Some embodiments of the invention may use output of seeded random number generator (the seed may be the UEID or a function thereof). In some embodiments, the value that is stored on those symbols may be the UEID itself or any function thereof. For example, a random number generator may use the UEID as its initial stage (seed) and the output (e.g., a long sequence) may be placed on the selected frozen symbols.

In some embodiment of the invention, an error detection code (e.g., CRC) may be concatenated to the polar code, in which case, the binary representation of the UEID (or a function thereof) may be xored with the error detection code parity, or manipulated in any other deterministic way.

Embedding an UEID sequence (or function thereof) placed on selected frozen symbols may improve the efficiency of encoding the offset vector d (at the transmitting device UEID encoder, e.g., 141 of FIG. 1B) and/or the offset vector d' (at the receiving device UEID encoder, e.g., 154 of FIG. 1B). The specific rows of the polar code generating matrix are generated by multiplying the UEID sequence v with the generating matrix.

Conventional polar code encoders store explicit representations of generating matrices for polar codes (e.g., Kronecker power matrices of various orders, $G^{(1)}, G^{(2)}, \ldots, G^{(m)}$). A different matrix is stored for each different length $2^n$ of the codeword. As the length N of the codeword increases, the matrix size and amount of data stored grows quadratically (e.g., as $N^2$). This requires massive storage space allocated to store all the polar code generating matrices for any or many lengths of codes. Some encoders also support multiple code definitions (e.g. different set of frozen symbols), which further multiplies the storage requirements. These massive memory requirements may cause systems to limit the length of codes or prohibit the use of multiple code definitions due to the associated large memory consumption.

According to some embodiments of the invention, there is provided a system and method for fast and efficient construction and encoding of rows of the generating matrix on-the-fly (e.g., in real-time) during the encoding process (e.g., after receiving the codeword to be encoded). Accordingly, the generating matrices for polar codes do not need to be pre-stored prior to the encoding process, thereby saving massive amount of storage space typically allocated to store these matrices. On-the-fly construction of generating matrices was not previously possible for many types that do not employ a set rule or formula for constructing the generating matrix of the code. For polar codes, which do employ such a rule, constructing the generating matrix is time consuming and was conventionally performed by executing $n=\log_2(N)$ applications of the Kronecker product, which requires on the order of $O(4^n)=O(N^2)$ multiplications. According to some embodiments of the invention, there is provided a fast and efficient method for constructing individual values of a generating matrix for a code of length N using on the order of $\log_2(N)$ computations (per matrix coefficient) to allow on-the-fly construction of generating matrices of any order in a relatively small amount of time. A further reduction is gained when the code rate decreases e.g., by using frozen bits, such as, for UEID-shifted codewords. The rows of the generating matrix corresponding to frozen bits are zero-ed, and the coefficients for those rows need not be calculated. To generate m rows of the generating matrix, some embodiments of the invention perform $m \cdot 2^n \cdot n$ multiplications. If there are less than a linear number of N rows to generate, embodiments of the invention increase the speed of generating those matrix rows compared to conventional generation of the complete $G^{(n)}$ (that contains redundant rows) by using Kronecker power.

Let [u, v] be an information vector of two bits. The polar code kernel of [u, v] is its mapping to [u+v,v], which may be implemented by matrix multiplication $$[u, v]\begin{bmatrix} 1 & 0 \\ 1 & 1 \end{bmatrix} = [u + v, v].$$

So the generating matrix of length 2 bits polar code (i.e. [u+v, v]) is $$G^{(1)} = \begin{bmatrix} 1 & 0 \\ 1 & 1 \end{bmatrix}.$$

The generating matrix of a length 4 bits polar code may be the following Kronecker power matrix $$\text{e.g., } G^{(2)} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}.$$

is, $$\begin{bmatrix} 1 & 0 \\ 1 & 1 \end{bmatrix}^{(\otimes 2)}$$

A generating matrix row may be a row with binary index $[i_0, i_1] \in \{0,1\}^2$. A generating matrix column may be indexed by binary index $[j_0, j_1] \in \{0,1\}$. Let $f^{(2)}(j_0, j_1, i_0, i_1) = G_{i,j}^{(2)}$ were i and j are the decimal values of $[i_0, i_1]$ and $[j_0, j_1]$, respectively (e.g. $i=i_0+2\cdot i_1$ and $j=j_0+2\cdot j_1$). The following table specifies the values of $f^{(2)}(j_0, j_1, i_0, i_1)$:

| $j_0, j_1$ | 0, 0 | 1, 0 | 0, 1 | 1, 1 |
|---|---|---|---|---|
| $f^{(2)}(j_0, j_1, i_0, i_1)$ | 1 | $i_0$ | $i_1$ | $\text{and}(i_0, i_1)$ |

The rows of the generating matrix $G^{(3)}$ (for polar code of length $2^3=8$ bits) may be computed, for example, as follows:

If $j_2=0 \colon f^{(3)}(j_0,j_1,j_2,i_0,i_1,i_2)=f^{(2)}(j_0,j_1,i_0,i_1)$

If $j_2=1 \colon f^{(3)}(j_0,j_1,j_2,i_0,i_1,i_2)=\text{and}(i_2,f^{(2)}(j_0,j_1,i_0,i_1))$ In general, for polar code of length $2^n$ bits, the generating matrix may be $$G^{(n)} = \begin{bmatrix} 1 & 0 \\ 1 & 1 \end{bmatrix}^{(\otimes n)}$$

(e.g., the Kronecker power which is the iterated Kronecker product). This generating matrix may be constructed recursively. Each subsequent power generating matrix $G^{(n)}$ is the product of the previous power's generating matrix $G^{(n-1)}$ and the Kroneker power matrix $$\begin{bmatrix} 1 & 0 \\ 1 & 1 \end{bmatrix};$$

$$G^{(n)} = \begin{bmatrix} 1 & 0 \\ 1 & 1 \end{bmatrix} \otimes G^{(n-1)} = \begin{bmatrix} G^{(n-1)} & 0 \\ G^{(n-1)} & G^{(n-1)} \end{bmatrix}$$

This matrix can be defined by four quadrants, three of which duplicate the previous iterations power matrix $G^{(n-1)}$ and the upper-left quadrant which is the zero matrix. The quadrant may be determined by the most significant bit $j_{n-1}$ of the binary column index $[j_0, j_1, \ldots j_{n-1}] \in \{0,1\}$ and the most significant bit $i_{n-1}$ of the binary row index $[i_0, i_1, \ldots i_{n-1}] \in \{0,1\}$. Upper-left quadrant indices have $\{j_{n-1}=0, i_{n-1}=0\}$, upper-right quadrant indices have $\{j_{n-1}=1, i_{n-1}=0\}$, lower-left quadrant indices have $\{j_{n-1}=0, i_{n-1}=1\}$, and lower right quadrant indices have $\{j_{n-1}=1, i_{n-1}=1\}$. If the most significant column index bit $j_{n-1}$ is zero (two left quadrants or the first half of columns), the two quadrants have the same values as the previous iteration's generating matrix $G^{(n-1)}$:

If $j_{n-1}=0 \colon f^{(n)}(j_0^{(n-1)}, i_0^{(n-1)})=f^{(n-1)}(j_0^{(n-2)}, i_0^{(n-2)})$.

If the most significant column index bit $j_{n-1}$ is one, the index represents the two right quadrants (the second half of columns). The top-right quadrant is the zero matrix, which is the product of (and-ing) the most significant row index bit $i_{n-1}=0$ (representing the upper half of rows) and the previous iteration's generating matrix $G^{(n-1)}$. The bottom-right quadrant is the previous iteration's generating matrix $G^{(n-1)}$, which is the product of (and-ing) the most significant row index bit $i_{n-1}=1$ (representing the bottom half of rows) and the previous iteration's generating matrix $G^{(n-1)}$:

If $j_{n-1}=1$: $f^{(n)}(j_0^{(n-1)}, i_0^{(n-1)})=\text{and}(i_{n-1}, f^{(n-1)}(j_0^{(n-2)}, i_0^{(n-2)}))$.

Relying on the recursive structure of the generating matrix of polar codes (being specified by iterative applications of Kronecker product), an embodiment of the invention defines a simple combinational circuit for generating the values of any row of the generating matrix. The logical circuits include only AND logic gates (for fixed j) and O(n) inputs (where $n=\log_2(N)$ and N is the code length).

Figure 6:
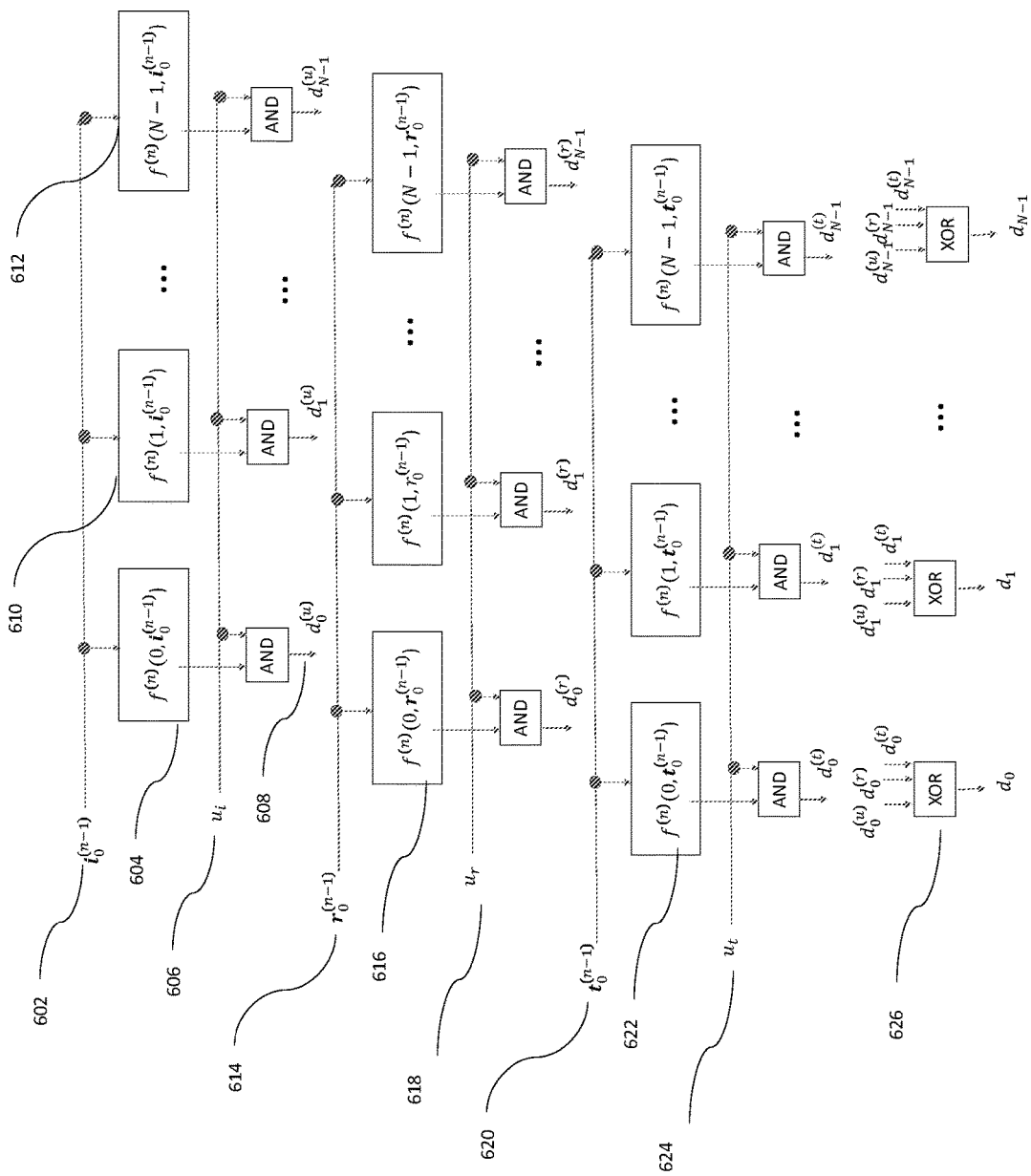
FIG. 6 is a schematic illustration of a polar code encoder with combinational circuits for efficiently computing coefficients of a generating matrix of polar codes with embedded UEIDs, according to some embodiments of the invention.

Reference is made to FIG. 6, which schematically illustrates a polar code encoder with combinational circuits for efficiently computing coefficients of a generating matrix of polar codes with embedded UEIDs on-the-fly, according to some embodiments of the invention. The polar code encoder may be message encoder 140, offset encoder 141 and/or offset encoder 154 of FIG. 1B.

In some embodiments, the encoder may encode a code of integer length N, e.g., with three information symbols having indices i, r, t with binary representation $i_0^{n-1}$, $r_0^{n-1}$, $t_0^{n-1}$. Each column of FIG. 6 may be used to generate one symbol of a polar codeword. Using all N columns may generate the entire codeword. Block 604 represents a combinational circuit for calculating the coefficient value of the column 0 of row #i of a generating matrix (e.g., the above Kronecker power matrix), where $i_0^{(n-1)}$ is input into the circuit. Block 610 represents a combinational circuit for calculating the value of the column 1 of row #i of the generating matrix, where $i_0^{(n-1)}$ is input into the circuit. Block 612 represents a combinational circuit for calculating the coefficient value of the column N−1 of row #i of the generating matrix, where $i_0^{(n-1)}$ is input into the circuit. For the next row below (616), similar circuits are used corresponding to row #r where $r_0^{(n-1)}$ is input into the circuits. For the next row below (626), similar circuits are used corresponding to row #t where $t_0^{(n-1)}$ is input into the circuits. Blocks 604, 610, 612, 616 and 622 are referred to as matrix coefficient combinational circuits. There are N such blocks for each row, such that the $j^{th}$ block corresponds to the $j^{th}$ column. The values of the matrix coefficient combinational circuits of the first row (e.g., 604, 610 and 612) are input into AND circuits and combined with the value of the input symbol $u_i$ (606), which outputs results denoted by $d_0^{(u)}$, $d_1^{(u)}$, . . . , $d_{N-1}^{(u)}$ respectively. Similarly, $d_0^{(r)}$, $d_1^{(r)}$, . . . , $d_{N-1}^{(r)}$ are generated by AND-ing the results of matrix coefficient combinational circuits of the second row (e.g., 616) with the input symbol $u_r$ (618). Finally, $d_0^{(t)}$, $d_1^{(t)}$ . . . $d_{N-1}^{(t)}$ are generated by AND-ing the results of matrix coefficient combinational circuits of the third row (e.g., 622) with the input symbol $u_t$ (624). The result of the circuit is the set of coefficient values $d_j=\text{xor}(d_j^{(u)}, d_j^{(r)}, d_j^{(t)})$ where $0 \le j \le N-1$. The computations in each row may be parallelized to increase speed (compared to sequential computations). Embodiments of the invention support higher rates of polar codes (i.e., larger numbers of input symbols) by adding rows of combinational circuits matrix calculation circuit together with AND circuits. The results of those AND circuits may be xor-ed by the existing values in a similar fashion.

In yet another embodiment, in which the encoding circuit of FIG. 6 supports a larger number of rows, the values of xor-ing the existing rows of the circuit may be stored in a register or other memory unit. After that set of additional rows (e.g., row indices and user input values) may be computed by the circuit such that the result of the current operation may be xored with the previous result (e.g., stored in the register) and stored back in the register. For example, to encode rows {6,7,8,20,21,22}, some embodiments would execute a first pass of the circuit with i=6, r=7, t=8 and then a second pass with i=20, r=21, t=22 and xor the result of the first pass with the result of second pass.

In yet another embodiment of the encoding circuit of FIG. 6, the circuit supports a limited number of columns (<N) such that in each point in time only selected column values may be generated. In such implementation, the index of the column may also be provided to the matrix coefficient combinational circuit (e.g., 604, 610, 612). For example, there may be $$\frac{N}{2}$$

matrix coefficients combinational circuits, such that column j of the circuit either corresponds to column j of the generating matrix or to column j+N/2 where $$0 \le j \le \frac{N}{2} - 1.$$

The circuit may first compute coefficients $$d_0^{\frac{N}{2}-1}$$

by sending appropriate control input to the matrix coefficient combinational circuits of the matrix coefficients. The circuit may then compute coefficients $d_{N/2}^{N-1}$ by sending appropriate control input to the matrix coefficient combinational circuits of the matrix coefficients.

In another embodiment of the invention, the binary representation of the UEID (or any function thereof) may be copied onto all frozen symbols of a message.

In another embodiment of the invention, the binary representation of the UEID (or any function thereof) may be copied onto all the frozen symbols and some of the non-frozen symbols of a message.

Embodiments of the invention for computing rows of the generating matrix on the fly reduce memory consumption by obviating the need to store those generating matrices. Polar code generating matrices typically occupy significant memory space, especially when multiple code definitions are utilized from multiple codebooks, requiring vast memory resources and slowing down processors due to the memory management. For a code length N bits and rate R, conventional storage of the matrix may require $RN^2$ bits. Embodiments of the invention may typically reduce memory for the same code to $RN \cdot \log_2 N$ bits, yielding a compression ratio of $$\frac{\log_2 N}{N}.$$

Figure 7:
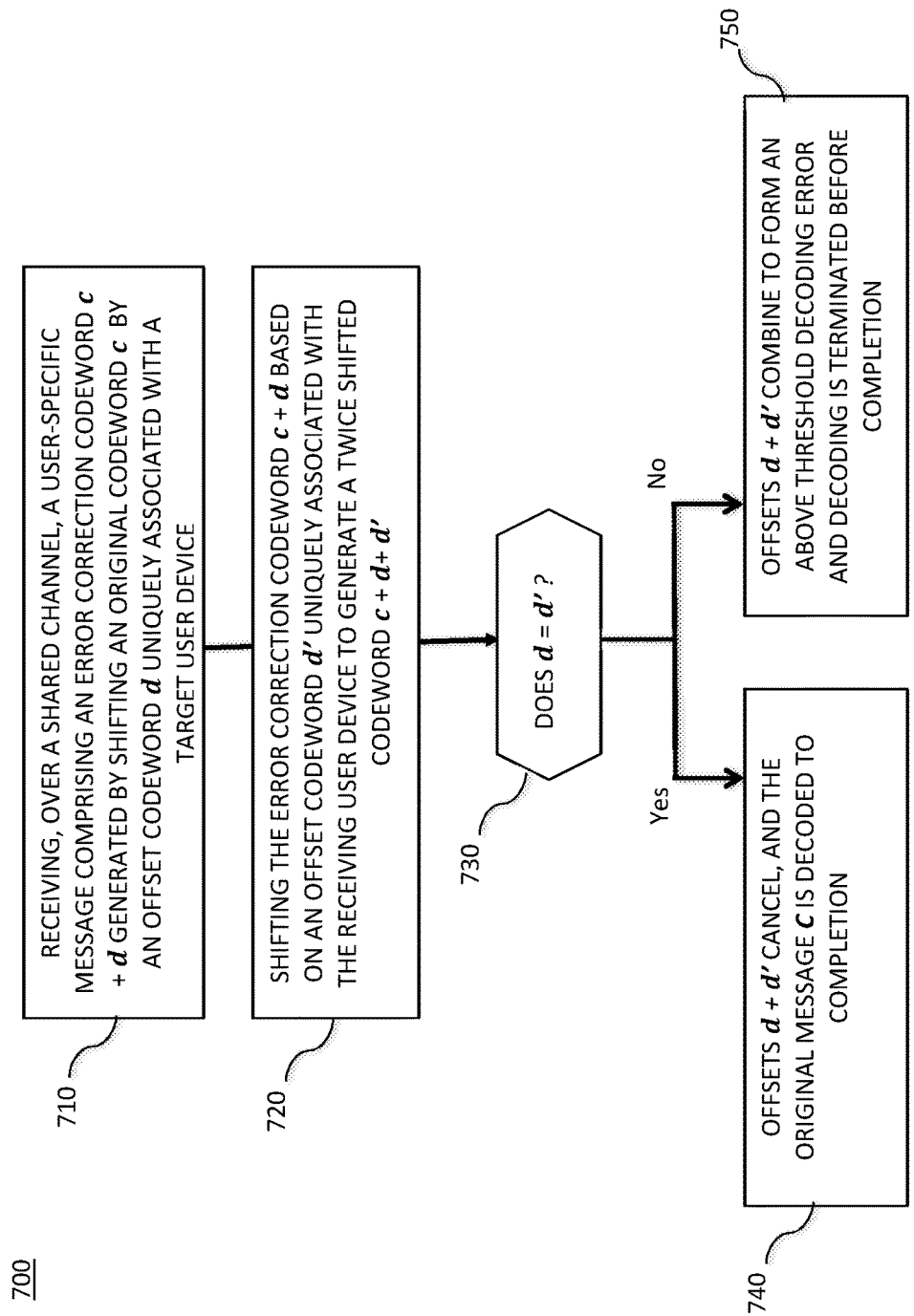
FIG. 7 is a flowchart of a method for early termination of a decoding process, according to some embodiments of the invention.

Reference is made to FIG. 7, which is a flowchart of a method 700 for early termination of a decoding process at a receiving user device, according to some embodiments of the invention. Operations 710-750 of method 700 may be executed at a receiving user device 112 using one or more processor(s) 120 or decoder(s) 126 or 150 in the system of FIGS. 1A and/or 1B.

In operation 710, a processor (e.g., processor 120 of FIG. 1A) may receive, from a communication channel (e.g., 102 of FIG. 1A or 144 of FIG. 1B) shared by multiple user devices (e.g., 112 of FIG. 1A), a user-specific message comprising a shifted error correction codeword (e.g., c+d) generated by shifting an original codeword (e.g., c) by an offset codeword (e.g., d) uniquely associated with a target user device.

In some embodiments, the error correction codeword (e.g., c) is a polar code codeword and a function of the target offset codeword (e.g., f(d)) is embedded on frozen symbols of the error correction codeword. In some embodiments, the processor may embed the function of target offset codeword on a set of available frozen symbols selected according to the following rule(s): select the set of frozen bits that correspond to rows of a polar code generating matrix associated with a relatively larger Hamming distance preferentially over rows associated with a relatively smaller Hamming distance, wherein if multiple indices of frozen symbols are associated with the same Hamming distance, select one of the multiple indices that is decoded earlier in a sequential decoder. In some embodiments, the processor may embed the function of the target offset codeword on a set of available frozen symbols selected according to the following rule(s): select the set of frozen bits that correspond to rows of a polar code generating matrix associated with a relatively larger quality factor preferentially over rows associated with a relatively smaller quality factor, wherein if multiple indices of frozen symbols are associated with the same quality factor, select one of the multiple indices that is decoded earlier in a sequential decoder. The function of the target offset codeword may be additionally or alternatively embedded on non-frozen symbols of the error correction codeword.

In operation 720, the processor may shift the shifted error correction codeword (e.g., c+d) based on an offset codeword (e.g., d') uniquely associated with the receiving user device, e.g., to generate a twice-shifted codeword (e.g., c+d+d').

Offsets (e.g., d and d') may be assigned to the multiple user devices such that each pair-wise combined offset (e.g., d+d') generates a codeword with an above threshold or maximal distance. Offsets (e.g., d and d') may be assigned to the multiple user devices such that each pair-wise combined offset (e.g., d+d') shifts the original codeword (e.g., c) generated from a codebook used for encoding to a new codeword (e.g., c+d+d') not in the codebook. Offsets (e.g., d and d') may be assigned to the multiple user devices such that a probability of the decoder terminating before completion when the offsets are not equal (solid curve in FIG. 5) is above a threshold. Offsets (e.g., d and d') may be assigned to the multiple user devices such that a probability of the decoder terminating before completion when the offsets are equal (dashed curve in FIG. 5) is below a threshold.

In operation 730, the processor may decode the received message. If the receiving device is the target device, a process or processor may proceed to operation 740. If the receiving device is not the target device, a process or processor may proceed to operation 750.

In operation 740, when the receiving device is the target device, the offset associated with the receiving device (e.g., d') is equal to the offset associated with the target device (e.g., d) and the sum of the two offsets cancel. Accordingly the twice-shifted codeword (e.g., c+d+d') is reduced to the original message (e.g., c) and the processor decodes the original codeword to completion.

In operation 750, when the receiving device is not the target device, the offset associated with the receiving device (e.g., d') is not equal to the offset associated with the target device (e.g., d) and the two offsets combine to form a non-zero and above threshold or maximal decoding error. Accordingly the error of the twice-shifted codeword (e.g., c+d+d') is maximized and the processor may terminate the decoding process before the received message is decoded to completion. The error may be computed based on a distance or path metric (e.g., in FIG. 5) between the decoded message and the received message.

In some embodiments, the processor may use a sequential decoder to decode in operation 730. The sequential decoder may decode the twice-shifted codeword (e.g., c+d+d') by sequentially in each of one or more stages: generate a list of candidate codewords for decoding the error correction codeword, measure the decoding error of the list of candidate codewords, if the decoding error is above the threshold, terminate decoding the message, and if the decoding error is below the threshold, remove one or more individual candidate codewords therefrom to generate a new list as input for iterating the sequential decoder. The process may repeat until the codeword is decoded.

Figure 8:
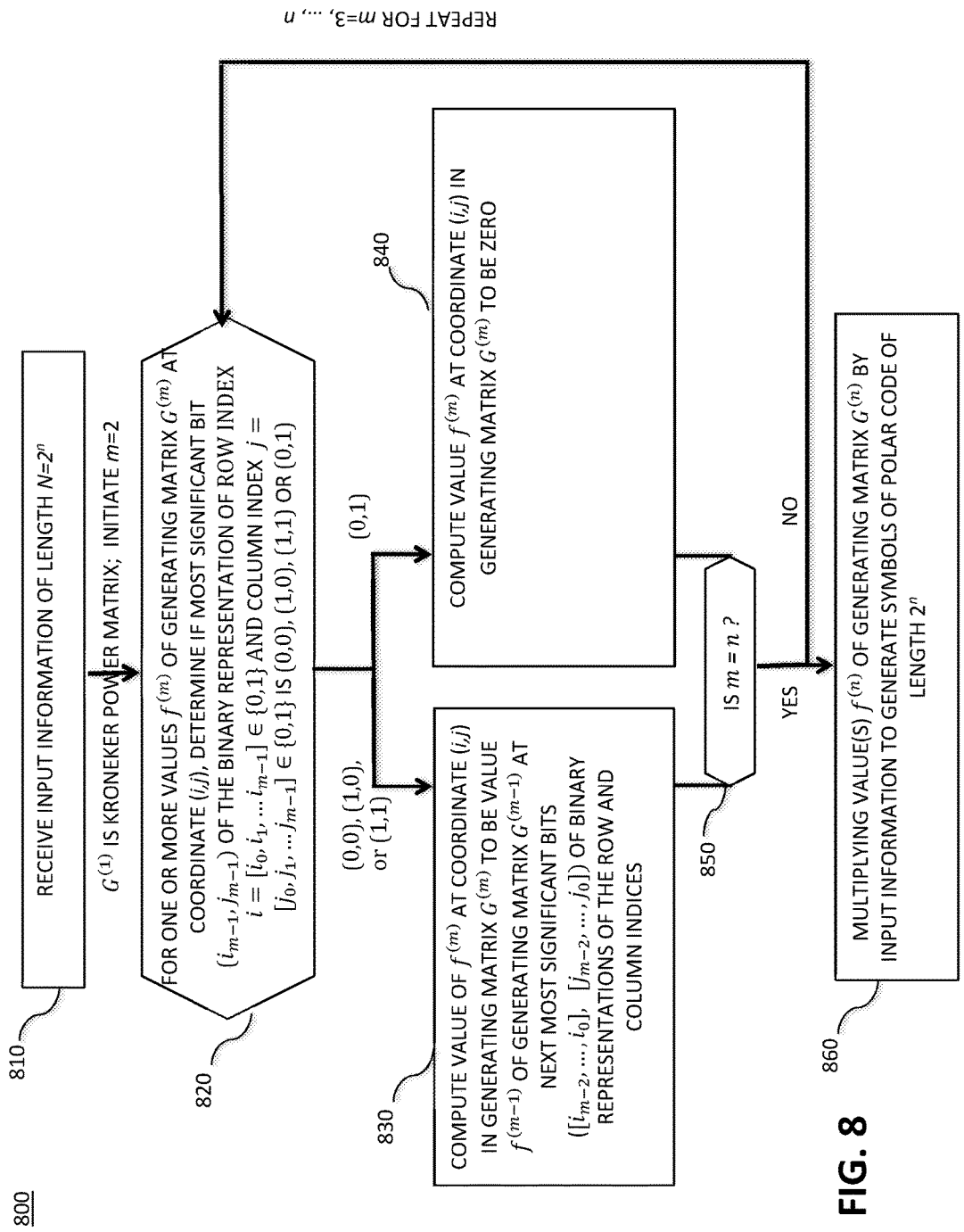
FIG. 8 is a flowchart of a method for polar code encoding by on-the-fly construction of a generating matrix for a polar code, according to some embodiments of the invention.

Reference is made to FIG. 8, which is a flowchart of a method 800 for polar code encoding by on-the-fly construction of a generating matrix for a polar code, according to some embodiments of the invention. Method 800 may be used for constructing one or more values $f^{(n)}$ corresponding to a coefficient of the generating matrix $G^{(n)}$ for a polar codeword of length $2^n$. In each of a plurality of recursive steps m=2, ..., n, the values $f^{(m)}$ of the generating matrix $G^{(m)}$ at a coordinate (i,j) may be computed as shown in operations 810-860. Operations 810-860 of method 800 may be executed at a polar encoder (e.g., encoder 141 and/or 154 using one or more processor(s) 118 or 120 in the system of FIGS. 1A and/or 1B).

In operation 810, a processor may receive initial input information (e.g., user-generated content) of length $N=2^n$ to be encoded as a polar codeword. That user information may be represented by a vector u of length N having N-k coordinates that are frozen (i.e., set to fixed zero value). The other k (non-frozen) coordinates may carry the user information. Let A be the set of those coordinates. The codeword c may be generated by multiplying each vector coordinate $u_i$ ($i \in \mathcal{A}$) by its corresponding row from $G^{(n)}$ (denoted $G_{i \rightarrow}^{(n)}$) and then adding them together. A first initialization step may define an initial matrix $G^{(1)}$ as the Kroneker power matrix of order one, $$\begin{bmatrix} 1 & 0 \\ 1 & 1 \end{bmatrix}.$$

The process may then iterate starting at m=2 (or another value) and may repeat for each step m=2, 3, ..., n to compute one or more values $f^{(m)}$ of the generating matrix $G^{(m)}$ at one or more respective coordinates (i,j) according to operations 820-840.

In operation 820, a processor may determine if the most significant bit $(i_{m-1}, j_{m-1})$ of a binary representation of a row index $i=[i_0, i_1, \ldots i_{m-1}] \in \{0,1\}$ and a column index $j=[j_0, j_1, \ldots j_{m-1}] \in \{0,1\}$ is (0,0), (1,0), or (1,1) (the two left or bottom-right quadrants of the matrix), or alternatively, if the most significant bit is (0,1) (the upper-right quadrant of the matrix). If the most significant bit is (0,0), (1,0), or (1,1), a process or processor may proceed to execute operation 830. If the most significant bit is (0,1), a process or processor may proceed to execute operation 840.

In operation 830, for $(i_{m-1}, j_{m-1})=(0,0), (1,0),$ or $(1,1)$, a processor may compute the value $f^{(m)}$ at coordinate (i,j) in the generating matrix $G^{(m)}$ to be the value $f^{(m-1)}$ of the generating matrix $G^{(m-1)}$ of the previous step m−1 at the next most significant bits $([i_{m-2}, \ldots, i_0], [j_{n-m}, \ldots, j_0])$ of the binary representations of the row and column indices.

In operation 840, for $(i_{m-1}, j_{m-1})=(0,1)$, a processor may compute the value $f^{(m)}$ at coordinate (i,j) in the generating matrix $G^{(n)}$ to be zero. When operation 840 is reached, the processor may determine that the value of final target $f^{(n)}(i_0^{n-1}, j_0^{n-1})$ is zero. In other words, the algorithm seeks for a combination of $(i_{m-1}, j_{m-1})=(0,1)$ for any point m=1, 2, 3, … n. If such a configuration exists, then $f^{(n)}(i_0^{n-1}, j_0^{n-1})=0$ and otherwise $f^{(n)}(i_0^{n-1}, j_0^{n-1})=1$.

In operation 850, the processor may determine if the step increment m is less than or equal to n. If m=n, the value $f^{(n)}$ has been computed, and a process or processor may proceed to operation 860. If m<n, the value $f^{(n)}$ has not yet been computed, and a process or processor may increment m and proceed to operation 860 to repeat the process for the next recursive step m+1.

Operations 820-850 may also repeat (sequentially or in parallel) for each of a plurality of coordinates (i,j) of the generating matrix $G^{(n)}$.

In operation 860, after the value(s) $f^{(n)}$ of the generating matrix $G^{(n)}$ have been computed, and the processor may multiply the one or more values $f^{(n)}$ of the generating matrix $G^{(n)}$ by the input information, for example, using the combinational circuits shown in FIG. 6, to generate one or more (e.g., all) bits of a polar codeword of length $2^n$.

Other operations or orders of operations may be used. Some operations may be skipped, for example, a processor may skip computing and multiplying operations for frozen bits of the polar code.

In an embodiment of the invention, a method is provided for constructing one or more values $f^{(n)}$ of a generating matrix $G^{(n)}$ for a polar codeword of length $2^n$ comprising:
in each of a plurality of recursive steps m=2, …, n compute the values $f^{(m)}$ of the generating matrix $G^{(m)}$ at a coordinate (i,j) as follows:
when the most significant bit $(i_{m-1}, j_{m-1})$ of a binary representation of a row index $i=[i_0, i_1, \ldots i_{m-1}] \in \{0,1\}$ and a column index $j=[j_0, j_1, \ldots j_{m-1}] \in \{0,1\}$ is (0,0), (1,0), or (1,1), the value $f^{(m)}$ at coordinate (i,j) in the generating matrix $G^{(m)}$ is the value $f^{(m-1)}$ of the generating matrix $G^{(m-1)}$ of the previous step at the next most significant bits $([i_{m-2}, \ldots, i_0], [j_{n-m}, \ldots, j_0])$ of the binary representations of the row and column indices;
when the most significant bit $(i_{m-1}, j_{m-1})$ of the binary representation of the row and column indices is (0,1), the value $f^{(m)}$ at coordinate (i,j) of the generating matrix $G^{(m)}$ is zero; and
multiplying the one or more values $f^{(n)}$ of the generating matrix $G^{(n)}$ by input information to generate bits of a polar codeword of length $2^n$.

In an embodiment of the invention, each generating matrix $G^{(m)}$ of a subsequent step m is the product of the generating matrix $G^{(m-1)}$ of the previous step m−1 and the Kronecker power matrix $$\begin{bmatrix} 1 & 0 \\ 1 & 1 \end{bmatrix},$$

such that, $$G^{(m)} = \begin{bmatrix} 1 & 0 \\ 1 & 1 \end{bmatrix} \otimes G^{(m-1)} = \begin{bmatrix} G^{(m-1)} & 0 \\ G^{(m-1)} & G^{(m-1)} \end{bmatrix}.$$

In an embodiment of the invention, when the most significant bit $j_{m-1}$ of the binary representation of the column index is one, the value $f^{(m)}$ at the coordinate (i,j) of the generating matrix $G^{(m)}$ is the product of the most significant bit $i_{m-1}$ of the binary representation of the row index $i=[i_0, i_1, \ldots i_{m-1}] \in \{0,1\}$ and the value $f^{(m-1)}$ of the generating matrix $G^{(m-1)}$ of the previous step at the next most significant bits $([i_{m-2}, \ldots, i_0], [j_{m-2}, \ldots, j_0])$ of the binary representation of the row and column indices.

In an embodiment of the invention, one or more values $f^{(n)}$ may be multiplied by the input information comprises executing a plurality of respective combinational circuits operating in parallel, wherein each sequential circuit (q):
computes the values $f^{(n)}$ of the (qth) column of the generating matrix $G^{(n)}$; and
multiplies the (qth) column of values $f^{(n)}$ by a row vector of the input information to generate the (qth) value of the polar codeword.

In an embodiment of the invention, computing and multiplying may be skipped for frozen bits of the polar codeword or for non-frozen bits that are zero.

In an embodiment of the invention, the input information is user-generated information and identification information uniquely associated with a target user device in a multi-user communication system.

In an embodiment of the invention, the method comprises:
shifting the polar codeword generated based on the user-generated information by the polar codeword generated based on the identification information; and
transmitting the shifted polar codeword over a communication channel shared by multiple user devices.

In an embodiment of the invention, the input information is identification information uniquely associated with a receiving user device in the multi-user communication system.

In an embodiment of the invention, the method comprises:
receiving, from a communication channel shared by multiple user devices, a user-specific message comprising a polar codeword generated by shifting an original polar codeword of user-generated information by an offset polar codeword of identification information uniquely associated with a target user device in a multi-user communication system;
shifting the received polar codeword based on an offset polar codeword of identification information uniquely associated with the receiving user device; and
decoding the received message, wherein:
if the receiving device is the target device, the offset polar codewords respectively associated therewith are equal and cancel, and the decoding the original polar codeword of user-generated information proceeds to completion, and if the receiving device is not the target device, the offset polar codewords respectively associated therewith are not equal and combine to form an above threshold decoding error and the decoding terminates before completion.

In an embodiment of the invention, a device may comprise an encoder for performing any of the aforementioned steps.

According to some embodiments of the invention, a system and method is provided for encoding ECC codewords in multiple user scenario, in which some of the messages are directed to only one (or some) of the users. In such scenarios, the decoder may detect as early as possible (in the decoding process) that a message is not directed to the user, and terminate the decoding process. In some embodiment, a system and method is provided to encode polar codes.

In one embodiment, a system and method is provided for encoding and decoding an ECC with an embedded user identifier within a codeword. An offset word is generated of the same length as an error correction codeword. The offset word may be added to the error correction codeword to create a "shifted" word. The shifted word may be modulated by a modulator. The shifted word may be transmitted over a shared channel to a receiver. The receiver may receive the modulated signal comprising the shifted codeword. The receiver may cancel the offset word from received observation, by manipulation of the input to the decoder. The receiver may then call a decoder on the manipulated input.

In one embodiment, the demodulator may not manipulate the input to the decoder and the decoder may take into account the offset word. In one embodiment, the user identifier offset words are selected such that any two codewords with different offset have a Hamming distance above some threshold $d_H$. In one embodiment, the user identifier offset words are selected such that any two modulated codewords with different user identifier offsets may have a Euclidian distance above some threshold $d_E$. In one embodiment, the user identifier offset words are selected such that the probability of the decoder terminating with error when wrong offset is assumed is above some threshold p.

In one embodiment, the ECC is a polar code and the user identifier offset set is generated by placing some function of the user-identifier on the frozen symbols and encoding it according to polar code mapping rule. In one embodiment, the user identifier offset vector is encoded by multiplying the vector by a partial generating matrix of the polar code. In one embodiment, a function of the user identifier is placed on frozen symbols according to the following rule(s): (a) frozen symbols corresponding to rows of large Hamming weight in the polar code generating matrix are preferred over frozen symbols with rows of lower weight and (b) if Hamming weight ties occur, frozen symbols are preferred that are decoded earlier in a sequential list decoder. Additionally or alternatively, in one embodiment, a function of the user identifier is placed on frozen symbols according to the following rule(s): (a) frozen symbols with a relatively higher quality factor are preferred over frozen symbols with a relatively lower quality factor and (b) if quality factor ties occur, frozen symbols are preferred that are decoded earlier in a sequential list decoder. The quality factor may include mutual information between the frozen symbol input, channel inputs and/or other selected input symbols. The quality factor may include decoding success probability of the frozen symbol, given channel inputs and other selected input symbols or $1-Z_i$ where $Z_i$ is the Bhattacharyya parameter of the frozen symbol i. In one embodiment, the ECC is a polar code and the user identifier offset set is generated by placing some function of the user-identifier on the frozen symbols and non-frozen symbols and encoding the offset set according to polar code mapping rules. A system is provided for encoding polar codes wherein the rows of the polar code generating matrix are generated by combinational circuits (e.g., as shown in FIG. 6).

In the foregoing description, various aspects of the present invention have been described. For purposes of explanation, specific configurations and details are set forth in order to provide a thorough understanding of the present invention. However, it will also be apparent to a person of ordinary skill in the art that the present invention may be practiced without the specific details presented herein. Furthermore, well-known features may be omitted or simplified in order not to obscure the present invention.

Unless specifically stated otherwise, as apparent from the foregoing discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

In accordance with any of the aforementioned embodiments of the invention, systems and methods may be software-implemented using dedicated instruction(s) or, alternatively, hardware-implemented using designated circuitry and/or logic arrays.

In accordance with any of the aforementioned embodiments of the invention, systems and methods may be executed using an article such as a computer or processor readable non-transitory storage medium, or a computer or processor storage medium, such as for example a memory (e.g. one or more memory unit(s) 122 and 124 of FIG. 1A or 148 of FIG. 1B), a disk drive, or a flash memory, for encoding, including or storing instructions which when executed by a processor or controller (e.g., one or more controller(s) or processor(s) 118 and 120 of FIG. 1A), carry out methods disclosed herein.

Different embodiments are disclosed herein. Features of certain embodiments may be combined with features of other embodiments; thus, certain embodiments may be combinations of features of multiple embodiments.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

The invention claimed is:

1. A method for early termination of a decoding process performed at a receiving user device, the method comprising:
   receiving, from a communication channel shared by multiple user devices, a user-specific message comprising an error correction codeword generated by shifting an original codeword by an offset codeword uniquely associated with a target user device;
   shifting the error correction codeword based on an offset codeword uniquely associated with the receiving user device; and decoding the received message, wherein:
    if the receiving device is the target device, the offsets respectively associated therewith are equal and cancel, and the original message is decoded to completion, and
    if the receiving device is not the target device, the offsets respectively associated therewith are not equal and combine to form an above threshold decoding error and decoding is terminated before completion.

2. The method of claim 1 comprising decoding the received message, using a sequential decoder, by sequentially in each of one or more steps:
    generating a list of candidate codewords for decoding the error correction codeword;
    measuring the decoding error of the list of candidate codewords;
    if the decoding error is above the threshold, terminating decoding the message; and
    if the decoding error is below the threshold, removing one or more individual candidate codewords therefrom to generate a new list as input into the next step of the sequential decoder.

3. The method of claim 1, wherein the decoding error is based on a distance between the decoded message and the received message.

4. The method of claim 3, wherein the offsets are assigned to the multiple user devices such that each pair-wise combined offset generates a codeword with an above threshold distance.

5. The method of claim 1, wherein the offsets are assigned to the multiple user devices such that each pair-wise combined offset shifts the original codeword generated from a codebook used for encoding to a new codeword not in the codebook.

6. The method of claim 1, wherein the offsets are assigned to the multiple user devices such that a probability of the decoder terminating before completion when the offsets are not equal is above a threshold.

7. The method of claim 1, wherein the offsets are assigned to the multiple user devices such that a probability of the decoder terminating before completion when the offsets are equal is below a threshold.

8. The method of claim 1, wherein the error correction codeword is a polar code and a function of the target offset codeword is embedded on frozen symbols of the error correction codeword.

9. The method of claim 8, wherein the target offset codeword is embedded on a set of available frozen symbols selected according to the following rule(s):
    select the set of frozen bits that correspond to rows of a polar code generating matrix associated with a relatively larger Hamming distance preferentially over rows associated with a relatively smaller Hamming distance,
    wherein if multiple sets of frozen symbols are associated with the same Hamming distance, select one of the multiple sets that is decoded earlier in a sequential decoder.

10. The method of claim 8, wherein the target offset codeword is embedded on a set of available frozen symbols selected according to the following rule(s):
    select the set of frozen bits that correspond to rows of a polar code generating matrix associated with a relatively larger quality factor preferentially over rows associated with a relatively smaller quality factor,
    wherein if multiple sets of frozen symbols are associated with the same quality factor, select one of the multiple sets that is decoded earlier in a sequential decoder.

11. The method of claim 8, wherein the function of the target offset codeword is additionally embedded on non-frozen symbols of the error correction codeword.

12. A system for early termination of a decoding process performed at a receiving user device, the system comprising:
    one or more processors configured to:
        receive, from a communication channel shared by multiple user devices, a user-specific message comprising an error correction codeword generated by shifting an original codeword by an offset codeword uniquely associated with a target user device;
        shift the error correction codeword based on an offset codeword uniquely associated with the receiving user device; and
        decode the received message, wherein:
            if the receiving device is the target device, the offsets respectively associated therewith are equal and cancel, and the processors decode the original message to completion, and
            if the receiving device is not the target device, the offsets respectively associated therewith are not equal and combine to form an above threshold decoding error and the processors terminate decoding before completion.

13. The system of claim 12 comprising a sequential decoder configured to sequentially decode the received message, the sequential decoder configured, in each of one or more steps, to:
    generate a list of candidate codewords for decoding the error correction codeword;
    measure the decoding error of the list of candidate codewords;
    if the decoding error is above the threshold, terminate decoding the message; and
    if the decoding error is below the threshold, remove one or more individual candidate codewords therefrom to generate a new list as input into the next step of the sequential decoder.

14. The system of claim 12 comprising a demodulator to demodulate the received message.

15. The system of claim 12, wherein the error correction codeword is a polar code and a function of the target offset codeword is embedded on frozen symbols of the error correction codeword.

16. The system of claim 15, wherein the function of the target offset codeword is additionally embedded on non-frozen symbols of the error correction codeword.

17. The system of claim 15 comprising a plurality of combinational circuits for generating rows of a polar code generating matrix.

18. The system of claim 12 comprising a descrambler to descramble the received message.

19. The system of claim 12 comprising a memory to store an offset codeword uniquely associated with the receiving user device.

20. The system of claim 12 comprising a memory to store a unique identification code of the receiving user device, wherein the one or more processors are configured to encode the unique identification code to generate the offset codeword uniquely associated with the receiving user device.

* * * * *